(12) United States Patent
Kanno et al.

(10) Patent No.: US 9,780,147 B2
(45) Date of Patent: *Oct. 3, 2017

(54) SEMICONDUCTOR MEMORY DEVICE

(71) Applicant: TOSHIBA MEMORY CORPORATION, Minato-ku (JP)

(72) Inventors: Hiroshi Kanno, Yokkaichi (JP); Takayuki Tsukamoto, Yokkaichi (JP); Takamasa Okawa, Yokkaichi (JP); Atsushi Yoshida, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/209,164

(22) Filed: Jul. 13, 2016

(65) Prior Publication Data

US 2016/0322423 A1 Nov. 3, 2016

Related U.S. Application Data

(62) Division of application No. 14/305,371, filed on Jun. 16, 2014, now Pat. No. 9,437,296.

(Continued)

(51) Int. Cl.
*H01L 27/24* (2006.01)
*G11C 13/00* (2006.01)
*H01L 45/00* (2006.01)

(52) U.S. Cl.
CPC ........ *H01L 27/249* (2013.01); *G11C 13/0002* (2013.01); *G11C 13/0023* (2013.01);
(Continued)

(58) Field of Classification Search
CPC . H01L 45/1233; H01L 45/085; H01L 45/146; H01L 27/2454; G11C 13/0026;
(Continued)

(56) References Cited

U.S. PATENT DOCUMENTS 7,936,004 B2 5/2011 Kito et al.
8,278,170 B2 10/2012 Lee et al.
(Continued)

FOREIGN PATENT DOCUMENTS

JP 2007-266143 10/2007
JP 2010-287872 12/2010
(Continued)

OTHER PUBLICATIONS

Combined Taiwanese Office Action and Search Report issued on Jun. 7, 2016 in Patent Application No. 104103065 (with partial English language translation and English language translation of categories of cited documents).

*Primary Examiner* — Vanthu Nguyen
*Assistant Examiner* — Jerome Leboeuf
(74) *Attorney, Agent, or Firm* — Oblon, McClelland, Maier & Neustadt, L.L.P.

(57) ABSTRACT

A semiconductor memory device according to an embodiment includes a memory cell array and a control circuit. The memory cell array includes: a plurality of first conductive layers that are stacked; a memory layer provided on a side surface of the plurality of the first conductive layers; and a second conductive layer that contacts the side surface of the plurality of the first conductive layers via the memory layer. A thickness of the first conductive layer disposed at the first position is larger than a thickness of the first conductive layer disposed at the second position. The control circuit is configured to apply a first voltage to a selected first conductive layer. The control circuit changes a value of the first voltage based on a position of the selected first conductive layer.

8 Claims, 20 Drawing Sheets

Related U.S. Application Data

(60) Provisional application No. 61/935,232, filed on Feb. 3, 2014.

(52) U.S. Cl.
CPC ...... *G11C 13/0026* (2013.01); *G11C 13/0028* (2013.01); *G11C 13/0069* (2013.01); *H01L 27/2454* (2013.01); *H01L 45/085* (2013.01); *H01L 45/1233* (2013.01); *H01L 45/146* (2013.01); *G11C 2213/71* (2013.01)

(58) Field of Classification Search
CPC ............ G11C 13/0023; G11C 13/0002; G11C 13/0069; G11C 2213/71
See application file for complete search history.

(56) References Cited

U.S. PATENT DOCUMENTS

| | | | |
|---|---|---|---|
| 8,450,713 B2 | 5/2013 | Awaya et al. | |
| 8,971,092 B2* | 3/2015 | Kobayashi | H01L 27/2454 365/148 |
| 2007/0211537 A1 | 9/2007 | Park | |
| 2010/0019310 A1* | 1/2010 | Sakamoto | H01L 27/11578 257/324 |
| 2011/0199825 A1* | 8/2011 | Han | G11C 16/10 365/185.11 |
| 2011/0199833 A1 | 8/2011 | Shim | |
| 2011/0299314 A1* | 12/2011 | Samachisa | G11C 13/003 365/51 |
| 2012/0104351 A1 | 5/2012 | Wei | |
| 2012/0248399 A1* | 10/2012 | Sasago | H01L 27/2409 257/4 |
| 2013/0043455 A1 | 2/2013 | Bateman | |
| 2013/0198440 A1 | 8/2013 | Oh | |
| 2014/0209853 A1* | 7/2014 | Yamato | H01L 45/1226 257/5 |
| 2015/0155033 A1* | 6/2015 | Shepard | G11C 8/14 365/148 |

FOREIGN PATENT DOCUMENTS

| | | |
|---|---|---|
| JP | 2011-233831 | 11/2011 |
| JP | 2012-15517 | 1/2012 |
| JP | 2013-119409 | 6/2013 |

* cited by examiner

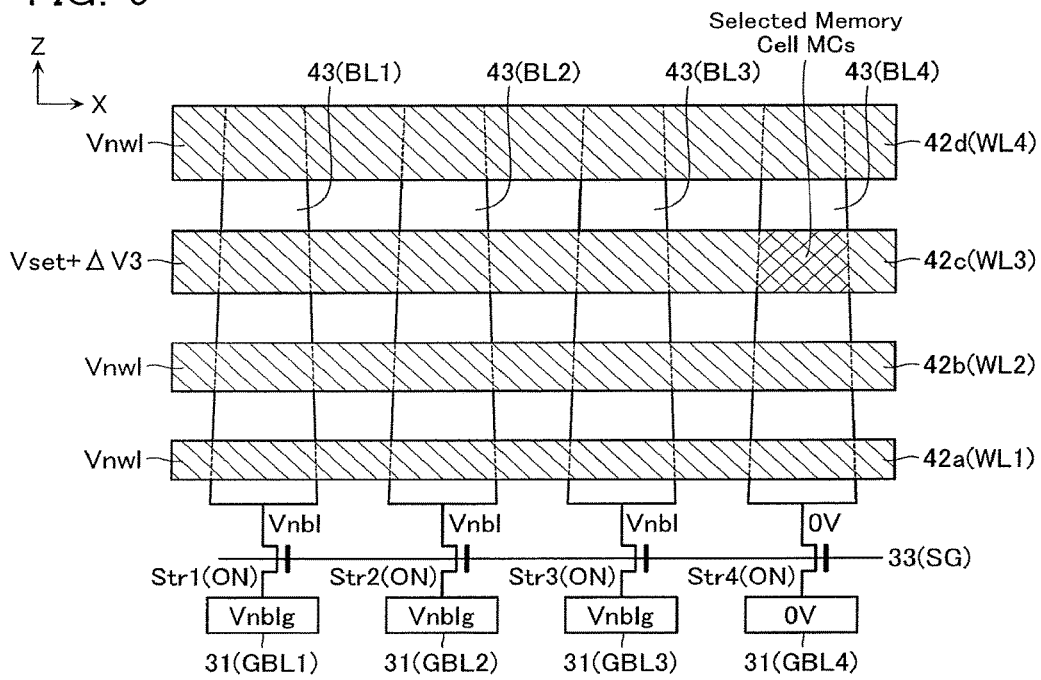
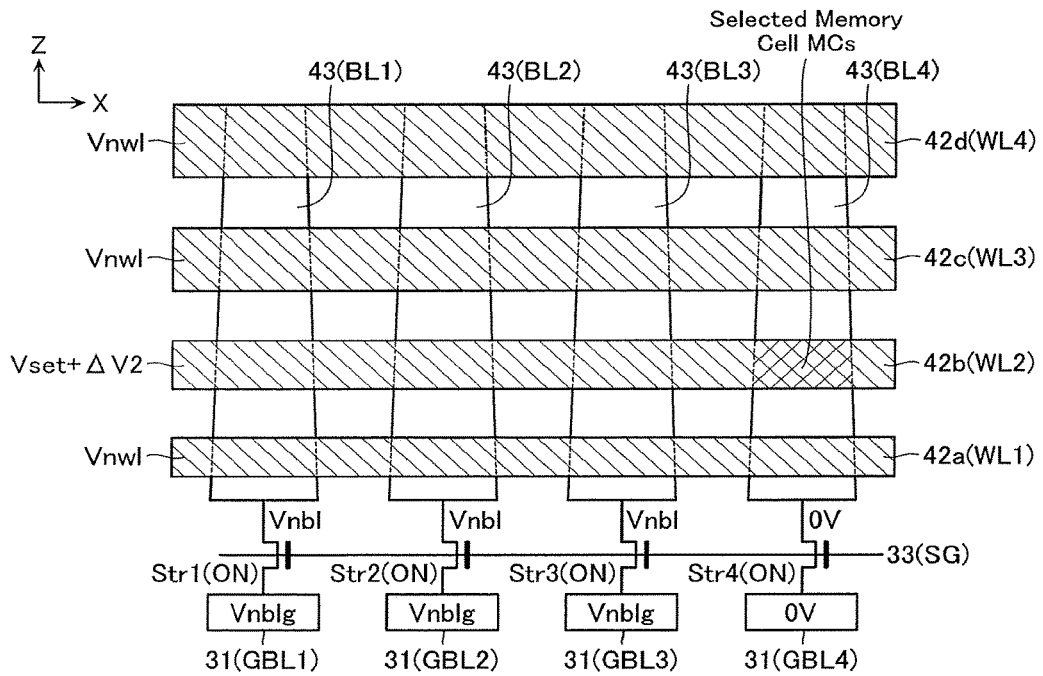

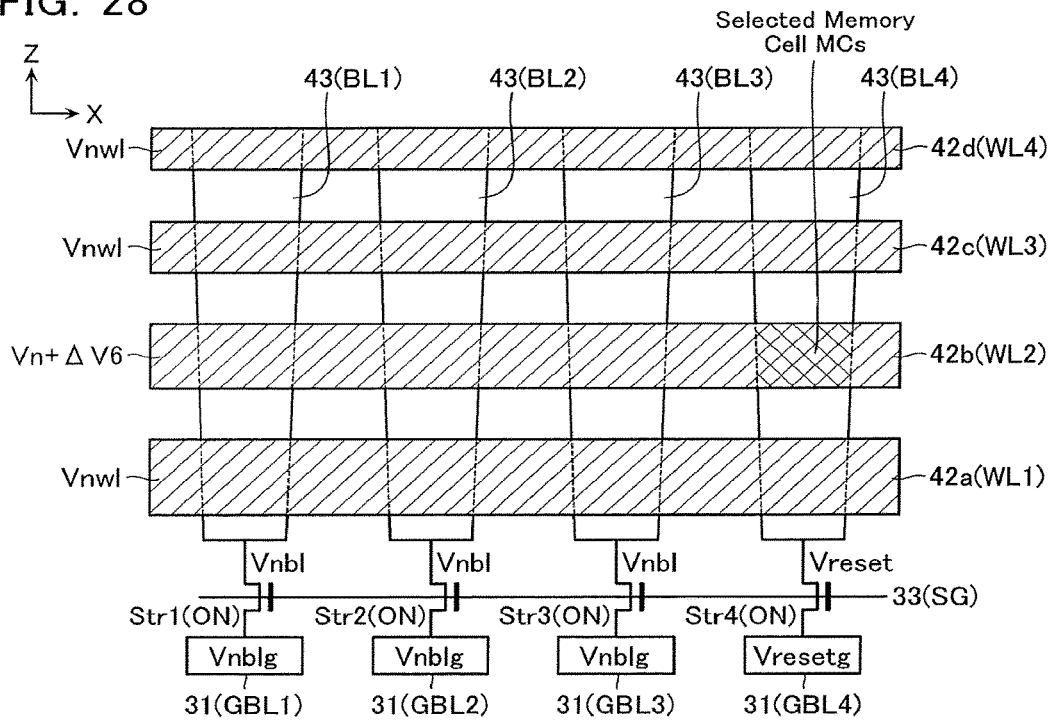
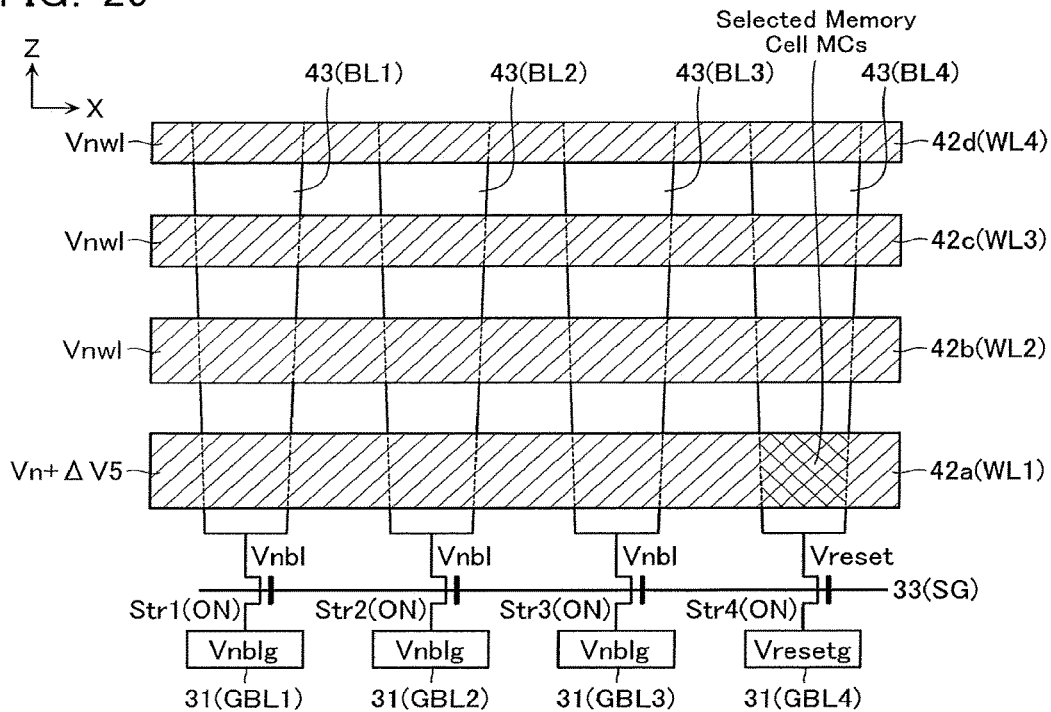

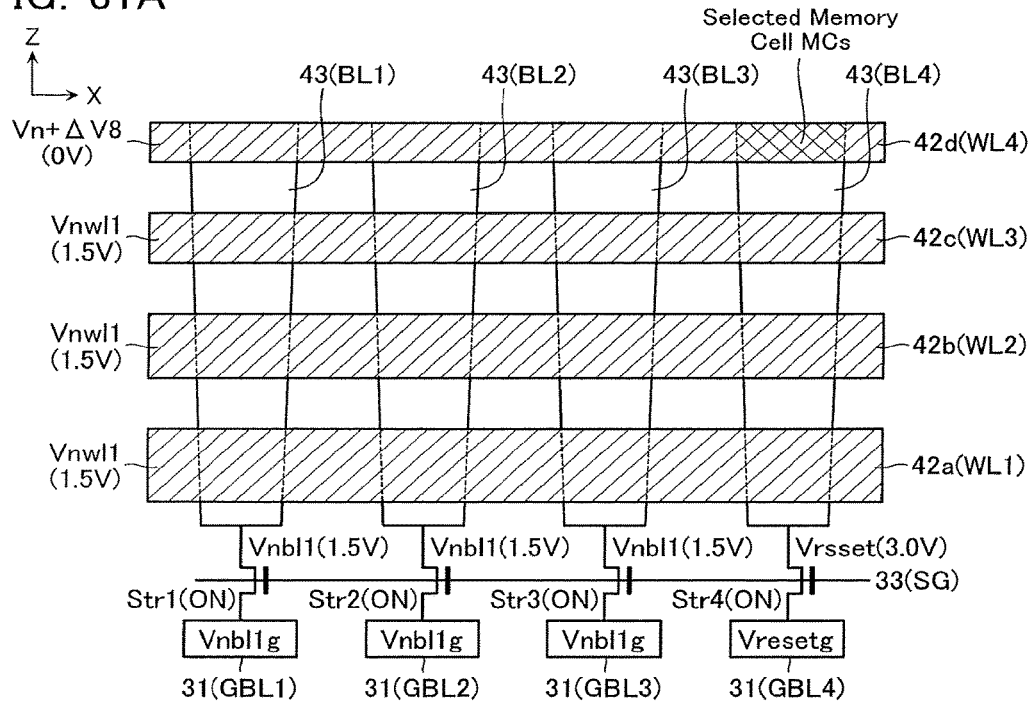
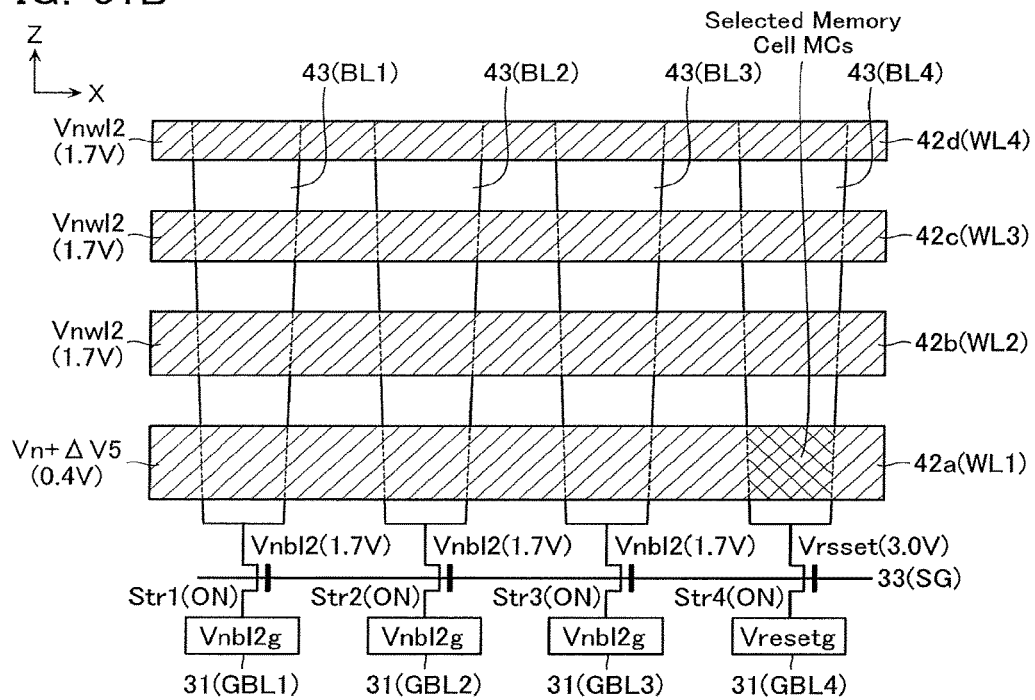

SEMICONDUCTOR MEMORY DEVICE

CROSS-REFERENCE TO RELATED APPLICATIONS

This application is a divisional of U.S. Ser. No. 14/305,371, filed Jun. 16, 2014. U.S. Ser. No. 14/305,371 claims the benefit of priority under 119(e) of U.S. Provisional Patent Application No. 61/935,232, filed on Feb. 3, 2014. The entire contents of each of which are incorporated herein by reference.

BACKGROUND

Field

Embodiments described in the present specification relate to a semiconductor memory device.

Description of the Related Art

In recent years, as semiconductor memory devices have become more highly integrated, ReRAM (Resistive RAM) has been proposed. In this ReRAM, a variable resistance element that reversibly changes its resistance value is utilized as memory. Moreover, in this ReRAM, a structure where the variable resistance element is provided between a sidewall of a word line extending parallel to a principal plane of a substrate and a sidewall of a bit line extending perpendicularly to the principal plane of the substrate enables an even higher degree of integration of a memory cell array to be achieved. However, variation sometimes occurs in a voltage applied to a memory cell connected between the bit line and the word line.

BRIEF DESCRIPTION OF THE DRAWINGS

FIG. 9 is an example of a cross-sectional view showing a method of operation of the memory cell array 11 according to the first embodiment.

FIG. 10 is an example of a cross-sectional view showing a method of operation of the memory cell array 11 according to the first embodiment.

FIG. 28 is an example of a cross-sectional view showing a method of operation of the memory cell array 11 according to the seventh embodiment.

FIG. 29 is an example of a cross-sectional view showing a method of operation of the memory cell array 11 according to the seventh embodiment.

FIG. 31A is an example of a cross-sectional view showing a method of operation of a memory cell array 11 according to a ninth embodiment.

FIG. 31B is an example of a cross-sectional view showing a method of operation of the memory cell array 11 according to the ninth embodiment.

DETAILED DESCRIPTION

A semiconductor memory device according to an embodiment comprises a memory cell array and a control circuit. The memory cell array includes: a plurality of first conductive layers that are stacked in a first direction perpendicular to a substrate and extend in a second direction parallel to the substrate; a memory layer provided on a side surface of the plurality of the first conductive layers; and a second conductive layer that extends in the first direction and includes a first side surface that contacts the side surface of the plurality of the first conductive layers via the memory layer. A width in the second direction of the first side surface of the second conductive layer at a first position in the first direction is smaller than a width in the second direction of the first side surface of the second conductive layer at a second position lower than the first position. A thickness in the first direction of the first conductive layer disposed at the first position is larger than a thickness in the first direction of the first conductive layer disposed at the second position. The control circuit is configured to apply a first voltage to a selected first conductive layer of the first conductive layers and provide a second voltage to the second conductive layer. The control circuit is configured capable of, when the control circuit applies the first voltage to the selected first conductive layer, changing a value of the first voltage based on a position in the first direction of the selected first conductive layer.

First Embodiment

[Configuration]

Figure 1:
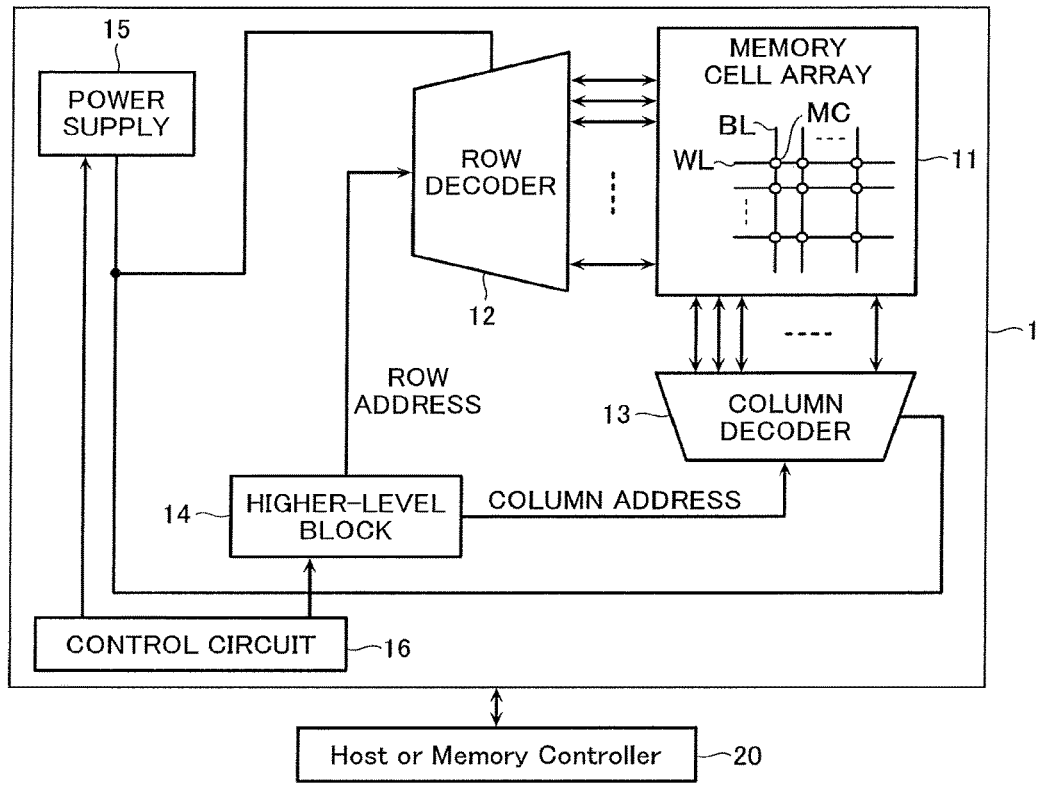
FIG. 1 is an example of a block diagram of a semiconductor memory device according to a first embodiment.

First, an overall configuration of a semiconductor memory device according to a first embodiment will be described. FIG. 1 is an example of a block diagram of the semiconductor memory device according to the first embodiment. As shown in FIG. 1, a semiconductor memory device 1 includes a memory cell array 11, a row decoder 12, a column decoder 13, a higher-level block 14, a power supply 15, and a control circuit 16.

The memory cell array 11 includes a plurality of word lines WL and bit lines BL that intersect each other, and memory cells MC disposed one at each of intersections of these word lines WL and bit lines BL. The row decoder 12 selects the word line WL during access (data erase/write/read). The column decoder 13 selects the bit line BL during access, and includes a driver that controls an access operation.

The higher-level block 14 selects the memory cell MC which is to be an access target in the memory cell array 11. The higher-level block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the higher-level block 14, and, moreover, performs control of the power supply 15, based on a command from a host or memory controller 20.

Figure 2:
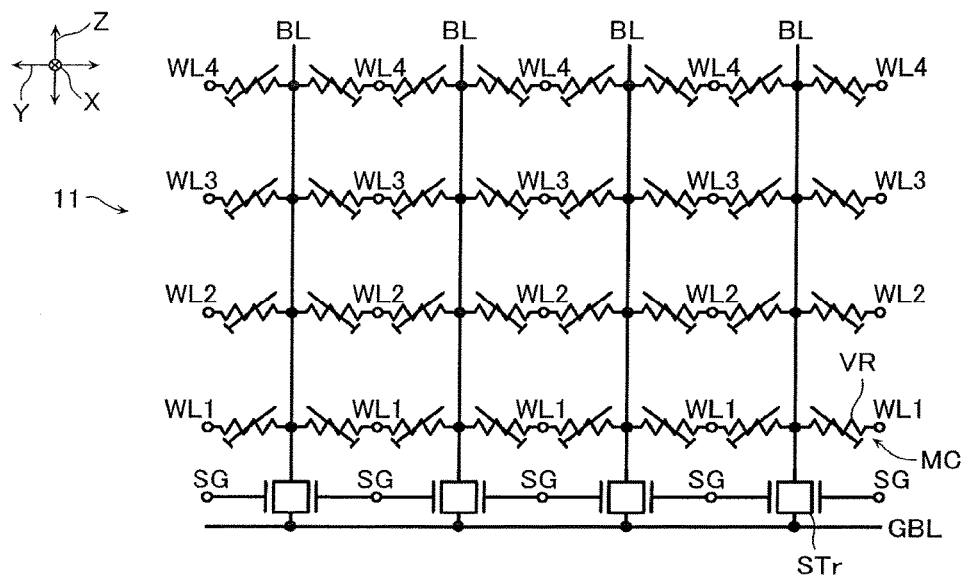
FIG. 2 is an example of a circuit diagram of a memory cell array 11 according to the first embodiment.
Figure 3:
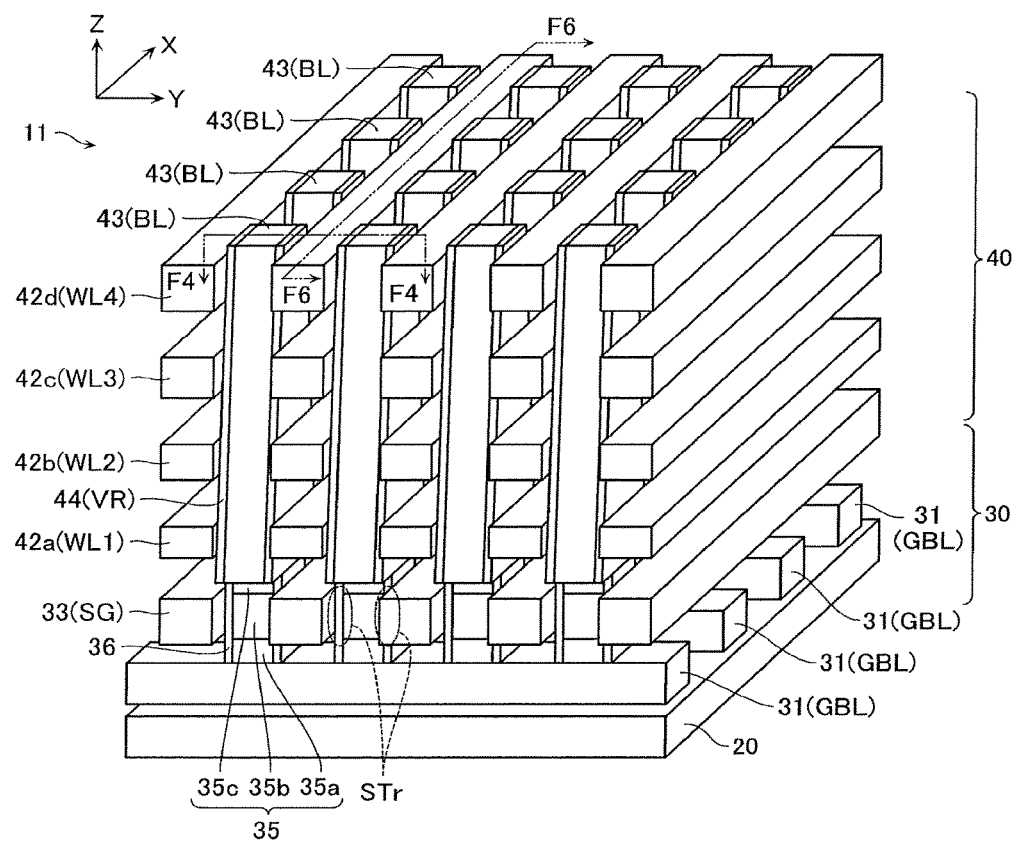
FIG. 3 is an example of a perspective view showing a stacked structure of the memory cell array 11 according to the first embodiment.

Next, the memory cell array 11 according to the first embodiment will be described in detail with reference to FIGS. 2 and 3. FIG. 2 is an example of a circuit diagram of the memory cell array 11. FIG. 3 is an example of a perspective view showing a stacked structure of the memory cell array 11. Note that in FIG. 2, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a select transistor STr, a global bit line GBL, and a select gate line SG, in addition to the above-mentioned word line WL, bit line BL, and memory cell MC.

As shown in FIGS. 2 and 3, word lines WL1 to WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions. In various kinds of operations, a selected word line WL of the word lines WL1 to WL4 can have any voltage applied thereto. In addition, a non-selected word line WL of the word lines WL1 to WL4 can have any voltage applied thereto.

As shown in FIG. 2, the memory cell MC includes a variable resistance element VR. The variable resistance element VR is electrically rewritable and can store data based on a resistance value of the variable resistance element VR. The variable resistance element VR changes from a high-resistance state (reset state) to a low-resistance state (set state) by a setting operation that applies a certain voltage or more to both terminals of the variable resistance element VR, and changes from the low-resistance state (set state) to the high-resistance state (reset state) by a resetting operation that applies a certain voltage or more to both terminals of the variable resistance element VR. Moreover, a resistance state of the variable resistance element VR is read by a read operation that applies a certain voltage or more to both terminals of the variable resistance element VR.

In addition, the variable resistance element VR, immediately after manufacturing, is in a state where its resistance state cannot be easily changed, and is in a high-resistance state. Accordingly, a forming operation is executed. In the forming operation, a high voltage greater than or equal to that of the setting operation and the resetting operation is applied to both terminals of the variable resistance element VR. As a result of this forming operation, a region (filament path) where locally it is easy for a current to flow is formed in the variable resistance element VR, whereby the variable resistance element VR can have its resistance state changed easily, and achieves a state of being operable as a storage element.

As shown in FIG. 2, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of select transistors STr arranged in a line in the Y direction. In addition, electrodes disposed between two select transistors STr arranged adjacently in the Y direction are commonly connected. The select gate lines SG are aligned with a certain pitch in the Y direction, and extend in the X direction. One select gate line SG is commonly connected to gates of a plurality of the select transistors STr arranged in a line in the X direction. Note that it is also possible to separate gate electrodes of two select transistors STr arranged adjacently in the Y direction and thereby operate each of the two select transistors STr independently.

Figure 4:
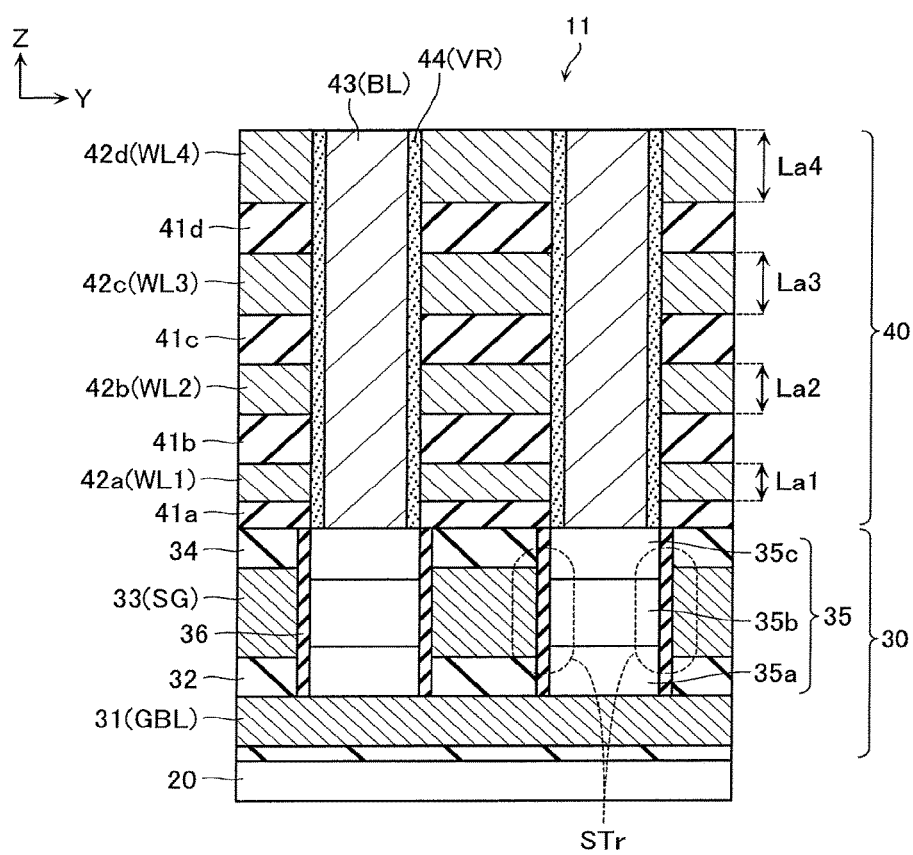
FIG. 4 is an example of a view of FIG. 3 as seen from an X direction.
Figure 5:
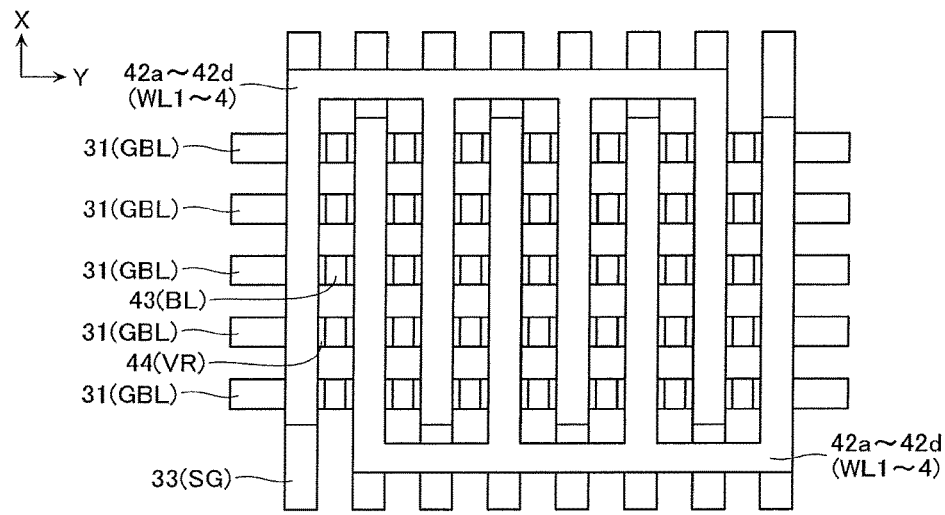
FIG. 5 is an example of a top view of FIG. 3.

Next, a stacked structure of the memory cell array 11 according to the first embodiment will be described with reference to FIGS. 3, 4, and 5. FIG. 4 is a view of an F4-F4 plane of FIG. 3 as seen from the X direction (Z-Y plane view), and FIG. 5 is a top view of FIG. 3. Note that in FIGS. 3 and 5, an interlayer insulating film is omitted.

As shown in FIGS. 3 and 4, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating layer 32, a conductive layer 33, and an interlayer insulating layer 34. These conductive layer 31, interlayer insulating layer 32, conductive layer 33, and interlayer insulating layer 34 are stacked in the Z direction perpendicular to the substrate 20. The conductive layer 31 functions as the global bit line GBL, and the conductive layer 33 functions as the select gate line SG and as the gate of the select transistor STr.

The conductive layers 31 are aligned with a certain pitch in the X direction parallel to the substrate 20, and extend in the Y direction (refer to FIG. 5). The interlayer insulating layer 32 covers an upper surface of the conductive layer 31. The conductive layers 33 are aligned with a certain pitch in the Y direction, and extend in the X direction (refer to FIG. 5). The interlayer insulating layer 34 covers a side surface and an upper surface of the conductive layer 33. For example, the conductive layers 31 and 33 are configured by polysilicon. The interlayer insulating layers 32 and 34 are configured by silicon oxide ($SiO_2$).

In addition, as shown in FIGS. 3 and 4, the select transistor layer 30 includes, for example, a column-shaped semiconductor layer 35 and a gate insulating layer 36. The semiconductor layer 35 functions as a body (channel) of the select transistor STr, and the gate insulating layer 36 functions as a gate insulating film of the select transistor STr.

The semiconductor layers 35 are disposed in a matrix in the X and Y directions, and extend in a column shape in the Z direction. In addition, the semiconductor layer 35 contacts the upper surface of the conductive layer 31, and contacts a side surface in the Y direction of the conductive layer 33 via the gate insulating layer 36. Moreover, the semiconductor layer 35 includes an N+ type semiconductor layer 35a, a P– type semiconductor layer 35b, and an N+ type semiconductor layer 35c that are stacked.

As shown in FIGS. 3 and 4, the N+ type semiconductor layer 35a contacts the interlayer insulating layer 32 at a side surface in the Y direction of the N+ type semiconductor layer 35a. The P– type semiconductor layer 35b contacts a side surface of the conductive layer 33 at a side surface in the Y direction of the P– type semiconductor layer 35b. The N+ type semiconductor layer 35c contacts the interlayer insulating layer 34 at a side surface in the Y direction of the N+ type semiconductor layer 35c. The N+ type semiconductor layers 35a and 35c are configured by polysilicon implanted with an N type impurity at a high concentration (for example, $1\times10^{19}$ to $1\times10^{21}$ $cm^{-3}$), and the P– type semiconductor layer 35b is configured by polysilicon implanted with a P type impurity at a low concentration (for example, $1\times10^{15}$ to $1\times10^{19}$ $cm^{-3}$). The gate insulating layer 36 is configured by, for example, silicon oxide ($SiO_2$).

As shown in FIGS. 3 and 4, the memory layer 40 includes, stacked alternately in the Z direction, interlayer insulating layers 41a to 41d and conductive layers 42a to 42d. The conductive layers 42a to 42d function as the word lines WL1 to WL4, respectively. The conductive layers 42a to 42d, when viewed from the Z direction, each include a pair of comb tooth shapes facing each other in the X direction (refer to FIG. 5). The interlayer insulating layers 41a to 41d are configured by, for example, silicon oxide ($SiO_2$), and the conductive layers 42a to 42d are configured by, for example, polysilicon.

Moreover, as shown in FIG. 4, the higher a layer in which a certain one of the conductive layers 42a to 42d is positioned, the larger is a thickness in the Z direction of that conductive layer. That is, a thickness La4 in the Z direction of the conductive layer 42d is larger than a thickness La3 in the Z direction of the conductive layer 42c in a layer below the conductive layer 42d. Similarly, the thickness La3 in the Z direction of the conductive layer 42c is larger than a thickness La2 in the Z direction of the conductive layer 42b in a layer below the conductive layer 42c, and the thickness La2 in the Z direction of the conductive layer 42b is larger than a thickness La1 in the Z direction of the conductive layer 42a in a layer below the conductive layer 42b. Now, a film thickness of the conductive layers 42a to 42d could be said to become gradually larger in the Z direction.

In addition, as shown in FIGS. 3 and 4, the memory layer 40 includes, for example, a column-shaped conductive layer 43 and a variable resistance layer 44. The conductive layer 43 functions as the bit line BL. The variable resistance layer 44 functions as the variable resistance element VR.

The conductive layers 43 are disposed in a matrix in the X and Y directions, contact an upper surface of the semiconductor layer 35, and extend in a column shape in the Z direction. The variable resistance layer 44 is provided between a side surface in the Y direction of the conductive layer 43 and side surfaces in the Y direction of the interlayer insulating layers 41a to 41d. In addition, the variable resistance layer 44 is provided between the side surface in the Y direction of the conductive layer 43 and side surfaces in the Y direction of the conductive layers 42a to 42d. The conductive layer 43 is configured by, for example, polysilicon. The variable resistance layer 44 is composed mainly of an oxide including at least any one element selected from the group consisting of Hf, Zr, Ni, Ta, W, Co, Al, Fe, Mn, Cr, and Nb. The variable resistance layer 44 is configured by, for example, a metal oxide (for example, $HfO_2$, $Al_2O_3$, $TiO_2$, NiO, $NO_3$, $Ta_2O_5$, and so on).

In addition, the variable resistance layer 44 may employ Si in a polycrystalline or amorphous state, or SiO, SiON, SiN, Ge, SiGe, GaAs, InP, GaP, GaInAsP, GaN, SiC, HfSiO, HfO, AlO, and so on. Moreover, a stacked film of the above-mentioned materials may also be employed in the variable resistance layer 44. Furthermore, the following may be disposed in the conductive layer 43 or the conductive layers 42a to 42d as an electrode of a resistance varying material, namely an electrode of, for example, Ag, Au, Ti, Ni, Co, Al, Fe, Cr, Cu, W, Hf, Ta, Pt, Ru, Zr, or Ir, or a nitride or carbide of these, and so on. In addition, a material having the above-described materials added to polycrystalline silicon may also be employed as the electrode. Moreover, a stopper layer of TaSiN may also be inserted on an opposite side to the electrode of the variable resistance layer 44.

Figure 6:
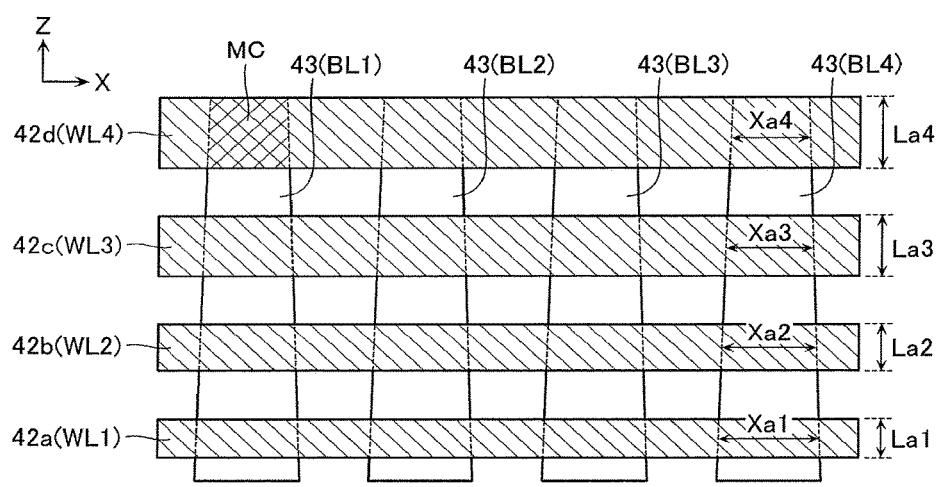
FIG. 6 is an example of a view of FIG. 3 as seen from a Y direction.

Next, a shape of the conductive layer 43 and the conductive layers 42a to 42d will be described specifically, with reference to FIG. 6. FIG. 6 is a view of an F6-F6 plane of FIG. 3 as seen from the Y direction (Z-X plane view). Note that in FIG. 6, the interlayer insulating layers 41a to 41d and the variable resistance layer 44 are omitted.

As shown in FIG. 6, the conductive layer 43 is formed in a tapered shape as seen from the Y direction, and a width in the X direction of a side surface in the Y direction of the conductive layer 43 becomes gradually smaller proceeding in a +Z direction (upward direction of FIG. 6). That is, the width in the X direction of the side surface in the Y direction of the conductive layer 43 at a first position is smaller than the width in the X direction of the side surface in the Y direction of the conductive layer 43 at a second position lower than the first position. For example, as shown in FIG. 6, if a width of the conductive layer 43 at a position corresponding to the conductive layer 42a is assumed to be Xa1, a width of the conductive layer 43 at a position corresponding to the conductive layer 42b is assumed to be Xa2, a width of the conductive layer 43 at a position corresponding to the conductive layer 42c is assumed to be Xa3, and a width of the conductive layer 43 at a position corresponding to the conductive layer 42d is assumed to be Xa4, then Xa1>Xa2>Xa3>Xa4. Note that this tapered shape of the conductive layer 43 can be formed by adjusting an etching condition during manufacturing. As mentioned above, in the present embodiment, the higher a layer in which a certain one of the conductive layers 42a to 42d is positioned, the larger a thickness in the Z direction of that conductive layer is made. Now, if thicknesses in the Z direction of the conductive layers 42a to 42d are assumed to be substantially uniform, then a facing area between the conductive layer 42a and the conductive layer 43 is largest, and a facing area between the conductive layer 42d and the conductive layer 43 is smallest. As a result, variation occurs in characteristics of the variable resistance element VR formed between the conductive layers 42a to 42d (word lines WL1 to WL4) and the conductive layer 43 (bit line BL).

Accordingly, in the present embodiment, as shown in FIG. 6, the higher a layer in which the conductive layers 42a to 42d are positioned, the larger the thicknesses La2 to La4 in the Z direction are made in accordance with the above-described shape of the conductive layer 43. For example, as shown in FIG. 6, if the thickness of the conductive layer 42a is assumed to be La1, the thickness of the conductive layer 42b is assumed to be La2, the thickness of the conductive layer 42c is assumed to be La3, and the thickness of the conductive layer 42d is assumed to be La4, then La1<La2<La3<La4. Therefore, facing areas between the conductive layers 42a to 42d and the conductive layer 43 can be made substantially constant. As a result, in the present embodiment, variation in characteristics of the variable resistance element VR can be suppressed.

[Method of Operation]

First, an outline of the setting operation will be described with reference to FIG. 7, and then a method of an operation of the semiconductor memory device according to the present embodiment will be described with reference to FIGS. 8 to 11.

Figure 7:
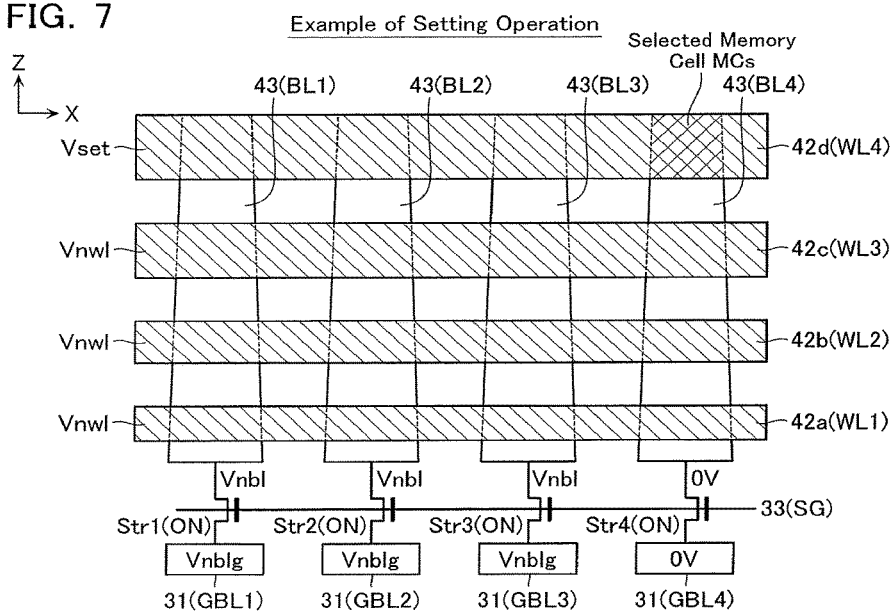
FIG. 7 is an example of a cross-sectional view showing an outline of a method of operation of the memory cell array 11.

FIG. 7 is a cross-sectional view for explaining a voltage application state when the setting operation is executed on the memory cell MC.

In the present embodiment, it is assumed that the setting operation is executed on a selected memory cell MCs provided between the conductive layer 42d (word line WL4) and the conductive layer 43 (bit line BL4). In this case, the conductive layer 42d (word line WL4) and the conductive layer 43 (bit line BL4) become, respectively, a selected word line WL and a selected bit line BL. Moreover, the conductive layers 42a to 42c (word lines WL1 to WL3) and the conductive layers 43 (bit lines BL1 to BL3) become, respectively, non-selected word lines WL and non-selected bit lines BL.

The setting operation is executed by applying to the selected memory cell MCs a setting voltage such that the variable resistance element VR changes from the high-resistance state (reset state) to the low-resistance state (set state). During the setting operation, the control circuit 16 applies a setting voltage Vset to the conductive layer 42d (selected word line WL4), and keeps a voltage of the conductive layer 31 (selected global bit line GBL4) connected to the conductive layer 43 (selected bit line BL4) at 0 V.

During the setting operation, the control circuit 16 applies a non-selected word line voltage Vnwl to the conductive layers 42a to 42c (non-selected word lines WL1 to WL3), and applies a non-selected global bit line voltage Vnblg to the conductive layers 31 (non-selected global bit lines GBL1 to GBL3) connected to the conductive layers 43 (non-selected bit lines BL1 to BL3). Now, the control circuit 16 sets the select transistors STr1 to STr4 to an on state. Due to this, 0 V is transferred to the conductive layer 43 (selected bit line BL4), and a non-selected bit line voltage Vnbl slightly lower than the non-selected global bit line voltage Vnblg is transferred to the conductive layers 43 (non-selected bit lines BL1 to BL3). As a result, the setting operation can be executed on the selected memory cell MCs only. Moreover, the non-selected word line voltage Vnwl and the non-selected bit line voltage Vnbl are set to a voltage such that the setting operation is not mistakenly executed on non-selected memory cells MC. For example, the non-selected word line voltage Vnwl and the non-selected bit line voltage Vnbl can be set to a voltage which is half of the setting voltage Vset (Vset/2).

FIGS. 8 to 11 are cross-sectional views for explaining a voltage application state when a setting operation according to the present embodiment is executed on the memory cell MC.

As mentioned above, during the setting operation, the control circuit 16 applies the setting voltage Vset to the selected word line WL. Now, in the present embodiment, the higher a layer in which the conductive layers 42a to 42d (word lines WL1 to WL4) are positioned, the larger the thicknesses La1 to La4 in the Z direction are made. Therefore, a wiring resistance of the conductive layers 42a to 42d (word lines WL1 to WL4) changes depending on a position in the Z direction of the conductive layers 42a to 42d (word lines WL1 to WL4). For example, the conductive layer 42a (word line WL1) has a largest wiring resistance, and the conductive layer 42d (word line WL4) has a smallest wiring resistance.

In the case where the wiring resistance of the conductive layers 42 (word lines WL) differs depending on a position in the Z direction, if a value of the setting voltage Vset is set to be identical in conductive layers 42 (word lines WL) having different positions in the Z direction, then voltage applied to the selected memory cell MCs varies based on the position in the Z direction.

Figure 8:
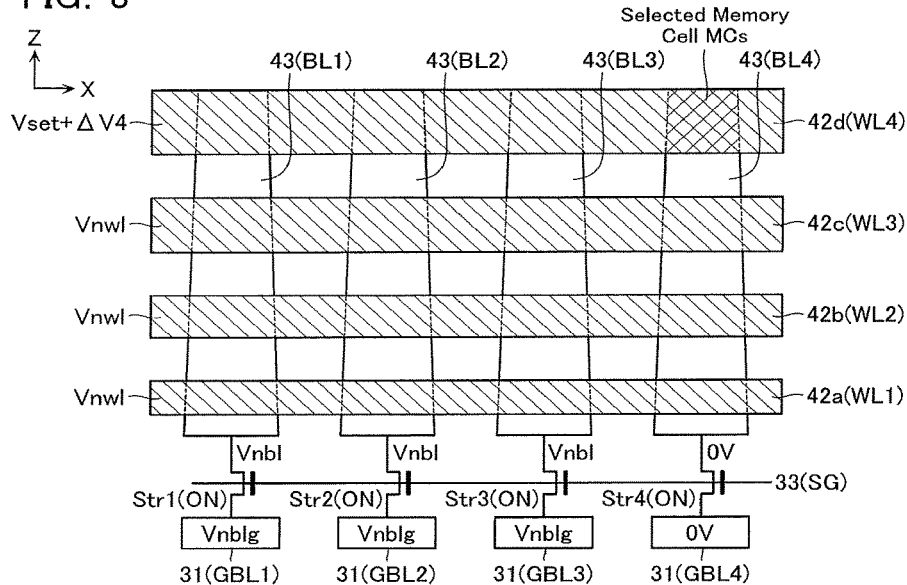
FIG. 8 is an example of a cross-sectional view showing a method of operation of the memory cell array 11 according to the first embodiment.
Figure 11:
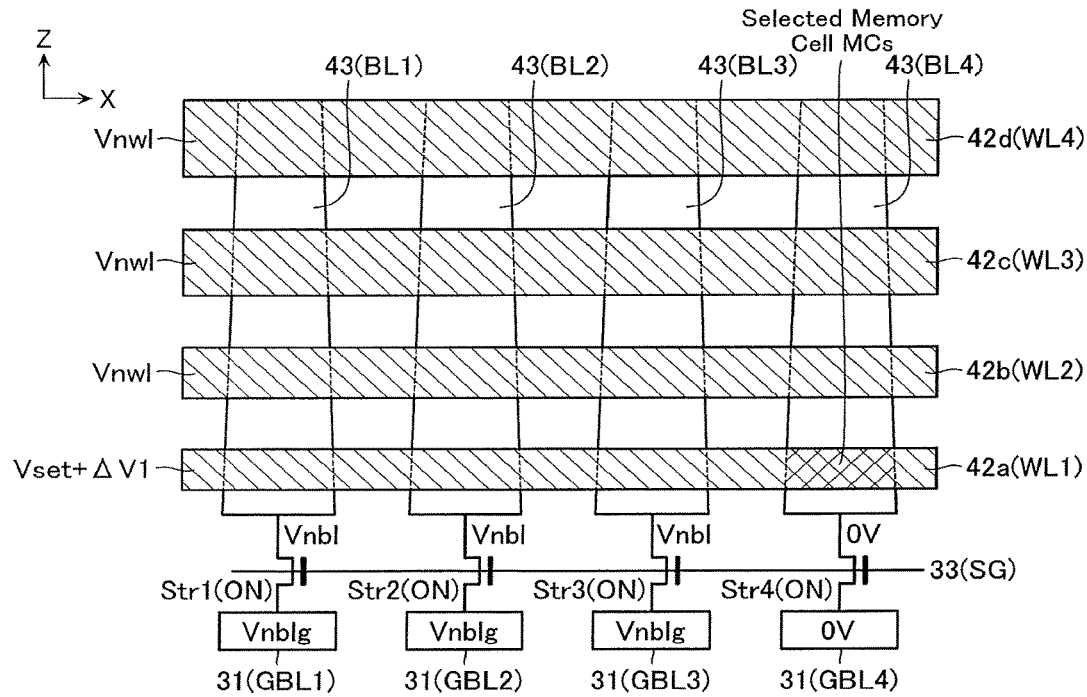
FIG. 11 is an example of a cross-sectional view showing a method of operation of the memory cell array 11 according to the first embodiment.

In contrast, in the present embodiment, as shown in FIGS. 8 to 11, the control circuit 16 sets each of the values of the setting voltage Vset applied to the conductive layers 42a to 42d (word lines WL1 to WL4) to a different value. As shown in FIG. 8, during the setting operation of the selected memory cell MCs connected to the conductive layer 42d (word line WL4), the control circuit 16 applies a setting voltage Vset+ΔV4 to the conductive layer 42d (word line WL4). As shown in FIG. 9, during the setting operation of the selected memory cell MCs connected to the conductive layer 42c (word line WL3), the control circuit 16 applies a setting voltage Vset+ΔV3 to the conductive layer 42c (word line WL3). As shown in FIG. 10, during the setting operation of the selected memory cell MCs connected to the conductive layer 42b (word line WL2), the control circuit 16 applies a setting voltage Vset+ΔV2 to the conductive layer 42b (word line WL2). As shown in FIG. 11, during the setting operation of the selected memory cell MCs connected to the conductive layer 42a (word line WL1), the control circuit 16 applies a setting voltage Vset+ΔV1 to the conductive layer 42a (word line WL1).

At this time, values ΔV1 to ΔV4 are set such that ΔV1>ΔV2>ΔV3>ΔV4. That is, the setting voltages Vset+ΔV1 to Vset+ΔV4 are set such that the higher a layer in which the conductive layers 42a to 42d (word lines WL1 to WL4) are positioned, the smaller an applied voltage during the setting operation becomes. Voltage values during the setting operation may be set such that the setting voltage Vset+ΔV1 is about 1.3 times the setting voltage Vset+ΔV4.

[Advantages]

In the operation of the present embodiment, the control circuit changes the value of the voltage applied to the selected conductive layer 42 (selected word line WL) based on the position in the Z direction of the selected conductive layer 42 (selected word line WL). By setting the setting voltage in this way, the voltage applied to the memory cell MC can be set substantially constant, even in conductive layers 42 (word lines WL) where the wiring resistance differs depending on the position in the Z direction. As a result, in the present embodiment, it is possible to suppress variation in the voltage applied to the selected memory cell MCs.

Second Embodiment

[Configuration]

Next, a semiconductor memory device according to a second embodiment will be described with reference to FIGS. 14 to 17. The second embodiment has a similar configuration to the first embodiment, hence in the present embodiment, a description of the configuration will be omitted. The present embodiment describes the resetting operation and the read operation.

[Method of Operation]

First, outlines of the resetting operation and the read operation will be described with reference to FIGS. 12 and 13, and then a method of an operation of the semiconductor memory device according to the present embodiment will be described with reference to FIGS. 14 to 17.

Figure 12:
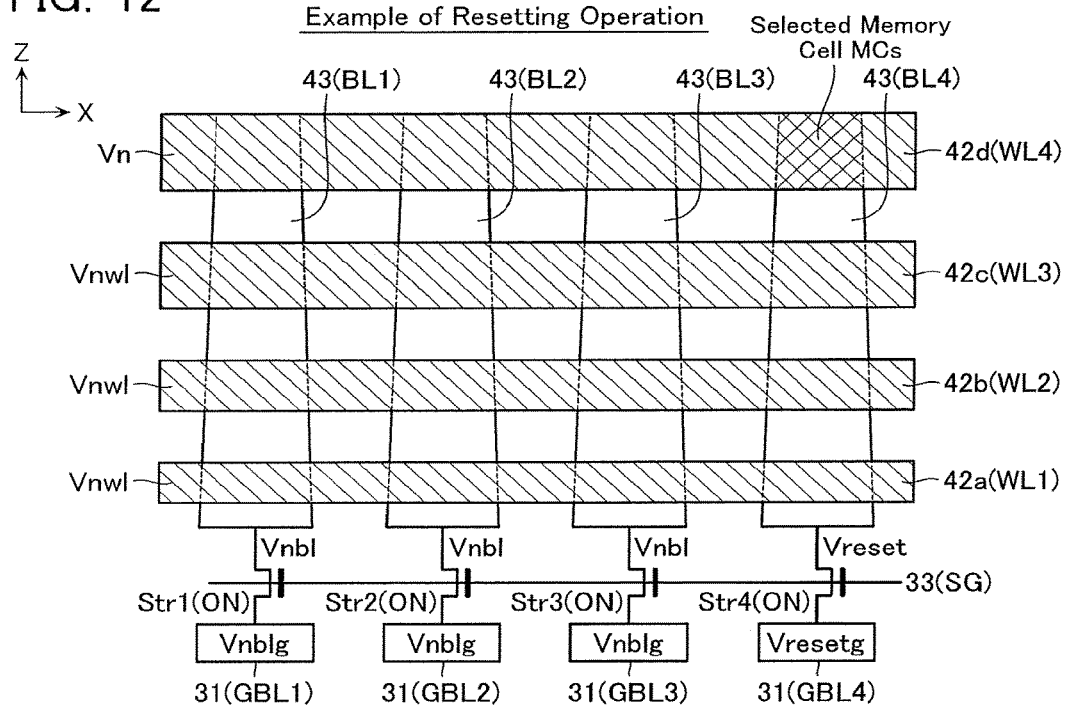
FIG. 12 is an example of a cross-sectional view showing an outline of a method of operation of the memory cell array 11.

FIG. 12 is a cross-sectional view for explaining a voltage application state when the resetting operation is executed on the memory cell MC.

In the present embodiment, it is assumed that the resetting operation is executed on a selected memory cell MCs provided between the conductive layer 42d (word line WL4) and the conductive layer 43 (bit line BL4). In this case, the conductive layer 42d (word line WL4) and the conductive layer 43 (bit line BL4) become, respectively, a selected word line WL and a selected bit line BL. Moreover, the conductive layers 42a to 42c (word lines WL1 to WL3) and the conductive layers 43 (bit lines BL1 to BL3) become, respectively, non-selected word lines WL and non-selected bit lines BL.

The resetting operation is executed by applying to the selected memory cell MCs a resetting voltage such that the variable resistance element VR changes from the low-resistance state (set state) to the high-resistance state (reset state). During the resetting operation, the control circuit 16 applies a voltage Vresetg to the conductive layer 31 (selected global bit line GBL4) connected to the conductive layer 43 (selected bit line BL4), and applies a voltage Vn to the conductive layer 42d (selected word line WL4).

During the resetting operation, the control circuit 16 applies the non-selected word line voltage Vnwl to the conductive layers 42a to 42c (non-selected word lines WL1 to WL3), and applies the non-selected global bit line voltage Vnblg to the conductive layers 31 (non-selected global bit lines GBL1 to GBL3) connected to the conductive layers 43 (non-selected bit lines BL1 to BL3). Now, the control circuit 16 sets the select transistors STr1 to STr4 to an on state. Due to this, a resetting voltage Vreset is transferred to the conductive layer 43 (selected bit line BL4), and the non-selected bit line voltage Vnbl slightly lower than the non-selected global bit line voltage Vnblg is transferred to the conductive layers 43 (non-selected bit lines BL1 to BL3) (note that Vreset>Vn). As a result, the resetting operation can be executed on the selected memory cell MCs only. Moreover, the non-selected word line voltage Vnwl and the non-selected bit line voltage Vnbl are set to a voltage such that the resetting operation is not mistakenly executed on non-selected memory cells MC. For example, the non-selected word line voltage Vnwl and the non-selected bit line voltage Vnbl can be set to a voltage which is half of the resetting voltage Vreset (Vreset/2).

Figure 13:
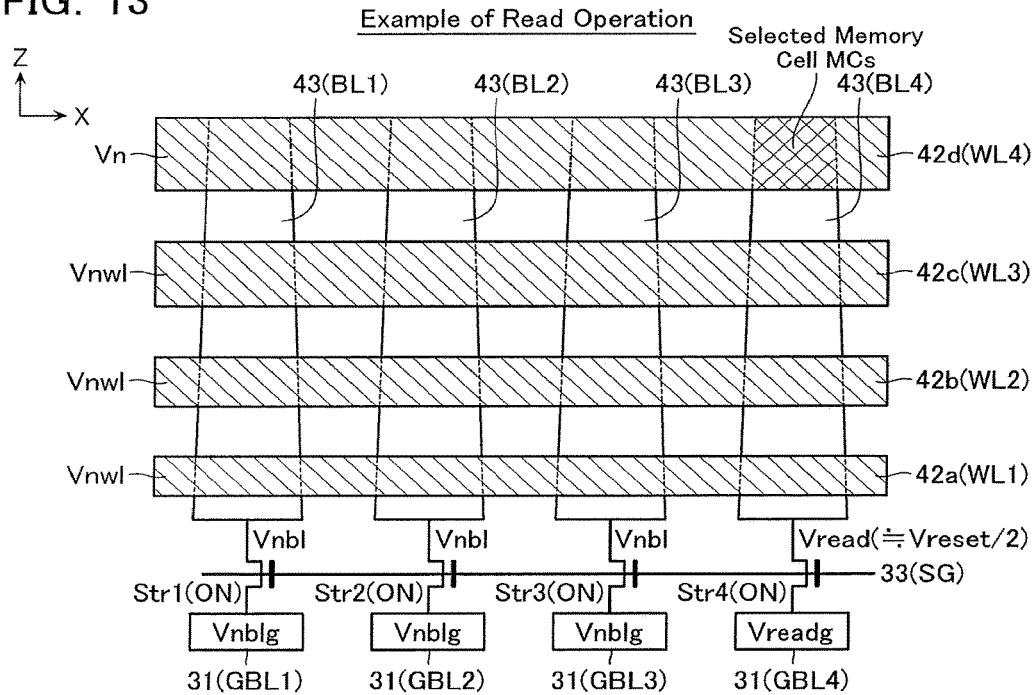
FIG. 13 is an example of a cross-sectional view showing an outline of a method of operation of the memory cell array 11.

FIG. 13 is a cross-sectional view for explaining a voltage application state when the read operation is executed on the memory cell MC. The read operation is executed by applying to the selected memory cell MCs a read voltage Vread for determining a resistance state of the variable resistance element VR. The read voltage Vread can be set to a voltage which is half of the resetting voltage Vreset (Vreset/2). In other respects, a method of voltage application of the read operation is similar to that of the resetting operation.

Now, the resetting operation and the read operation differ only in values of applied voltages, and are similar regarding a method of application of the voltages. The resetting operation will be described as an example below, but these operations may be applied also to the read operation.

FIGS. 14 to 17 are cross-sectional views for explaining a voltage application state when the resetting operation is executed according to the present embodiment on the memory cell MC.

As mentioned above, during the resetting operation, the control circuit 16 applies the resetting voltage Vreset to the selected bit line BL. Now, in the present embodiment, the higher a layer in which the conductive layers 42a to 42d (word lines WL1 to WL4) are positioned, the larger the thicknesses La1 to La4 in the Z direction are made. Therefore, a wiring resistance of the conductive layers 42a to 42d (word lines WL1 to WL4) changes depending on a position in the Z direction of the conductive layers 42a to 42d (word lines WL1 to WL4). For example, the conductive layer 42a (word line WL1) has a largest wiring resistance, and the conductive layer 42d (word line WL4) has a smallest wiring resistance.

In the case where the wiring resistance of the conductive layers 42 (word lines WL) differs depending on a position in the Z direction, if a value of a word line voltage is set to be identical in conductive layers 42 (word lines WL) having different positions in the Z direction, the voltage applied to the selected memory cell MCs varies based on the position in the Z direction.

Figure 14:
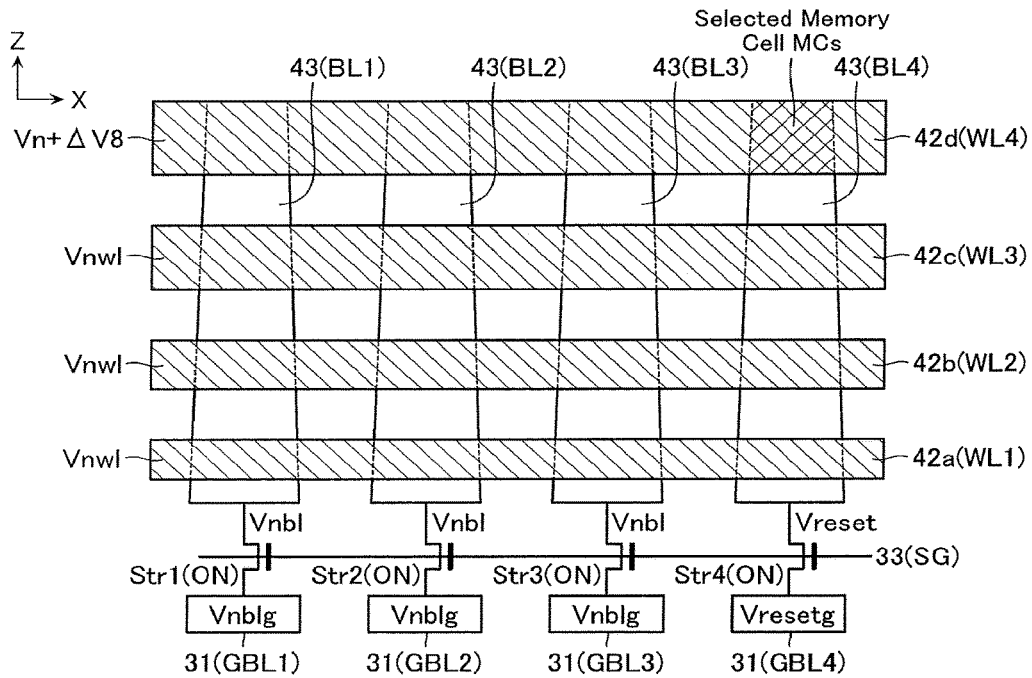
FIG. 14 is an example of a cross-sectional view showing a method of operation of a memory cell array 11 according to a second embodiment.
Figure 15:
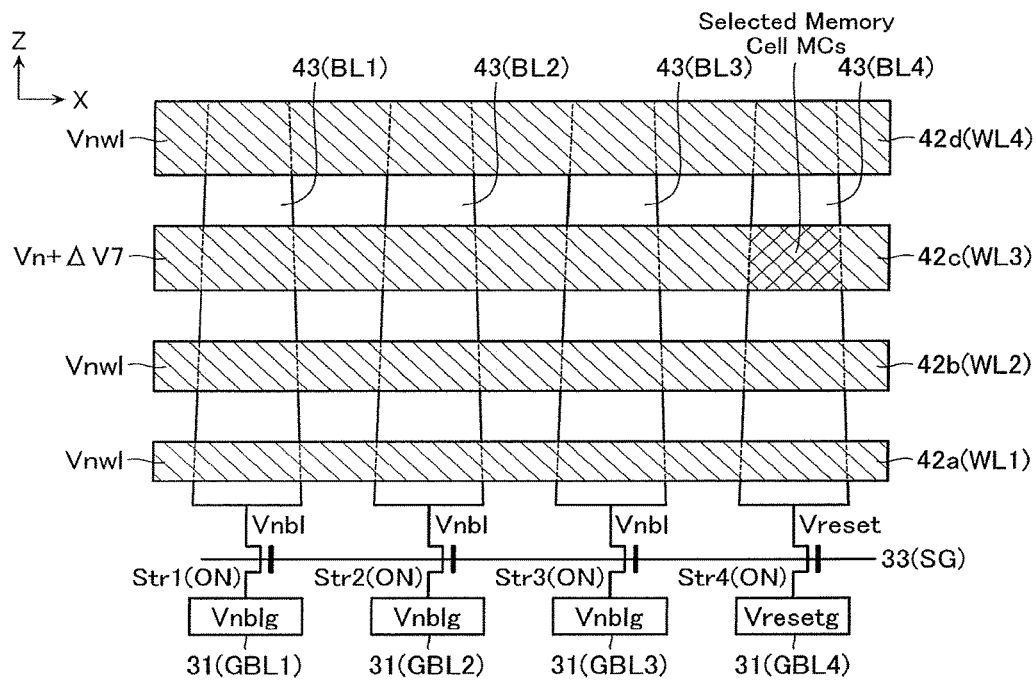
FIG. 15 is an example of a cross-sectional view showing a method of operation of the memory cell array 11 according to the second embodiment.
Figure 16:
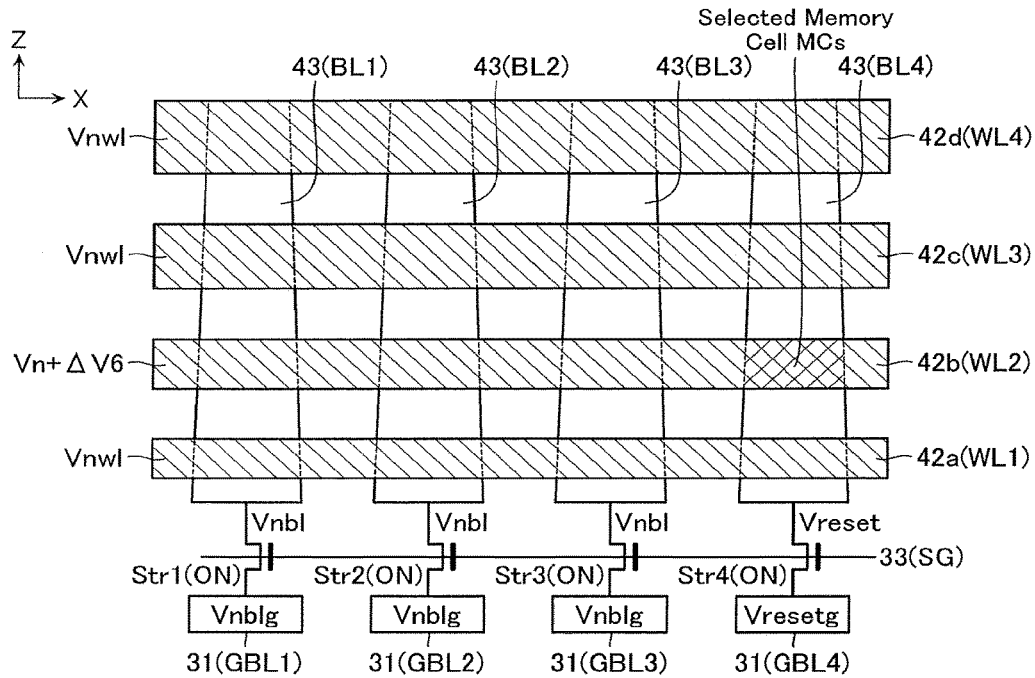
FIG. 16 is an example of a cross-sectional view showing a method of operation of the memory cell array 11 according to the second embodiment.
Figure 17:
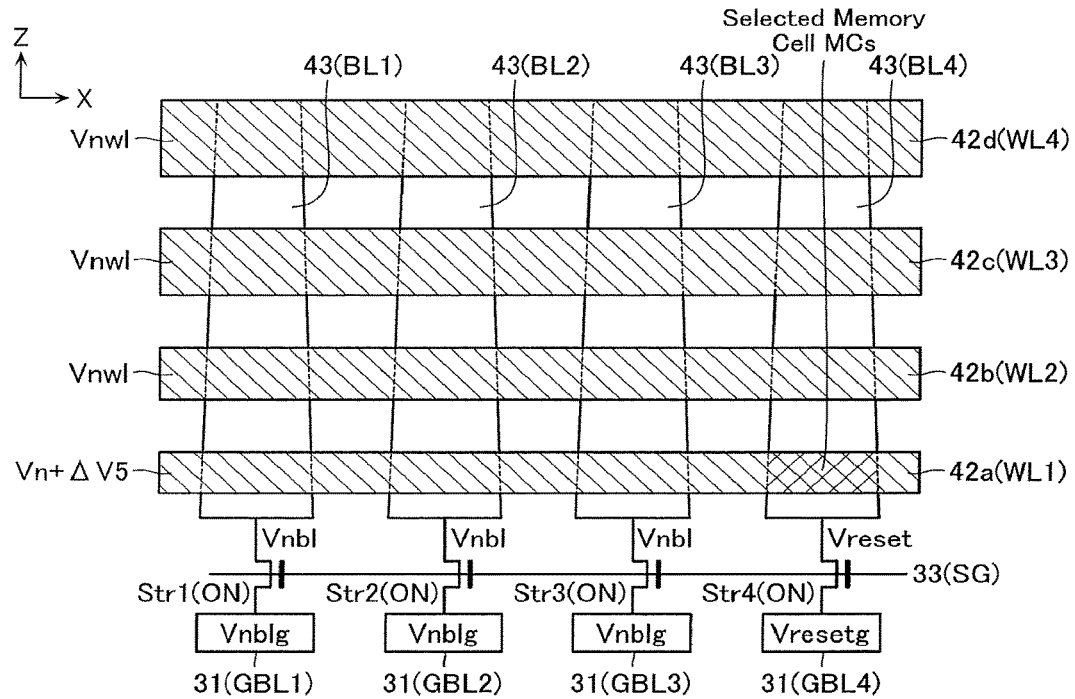
FIG. 17 is an example of a cross-sectional view showing a method of operation of the memory cell array 11 according to the second embodiment.

In contrast, in the present embodiment, as shown in FIGS. 14 to 17, the control circuit 16 sets each of values of the voltage applied to the conductive layers 42a to 42d (word lines WL1 to WL4) to different values. As shown in FIG. 14, during the resetting operation of the selected memory cell MCs connected to the conductive layer 42d (word line WL4), the control circuit 16 applies a voltage Vn+$\Delta$V8 to the conductive layer 42d (word line WL4). As shown in FIG. 15, during the resetting operation of the selected memory cell MCs connected to the conductive layer 42c (word line WL3), the control circuit 16 applies a voltage Vn+$\Delta$V7 to the conductive layer 42c (word line WL3). As shown in FIG. 16, during the resetting operation of the selected memory cell MCs connected to the conductive layer 42b (word line WL2), the control circuit 16 applies a voltage Vn+$\Delta$V6 to the conductive layer 42b (word line WL2). As shown in FIG. 17, during the resetting operation of the selected memory cell MCs connected to the conductive layer 42a (word line WL1), the control circuit 16 applies a voltage Vn+$\Delta$V5 to the conductive layer 42a (word line WL1).

At this time, values $\Delta$V5 to $\Delta$V8 are set such that $\Delta$V8>$\Delta$V7>$\Delta$V6>$\Delta$V5. That is, the voltages Vn+$\Delta$V5 to Vn+$\Delta$V8 are set such that the higher a layer in which the conductive layers 42a to 42d are positioned, the larger an applied voltage during the resetting operation becomes. Voltage values during the resetting operation may be set such that the voltage Vn+$\Delta$V8 is about one tenth of the resetting voltage Vreset.

[Advantages]

In the operation of the present embodiment, the control circuit changes the value of the voltage applied to the selected conductive layer 42 (selected word line WL) based on the position in the Z direction of the selected conductive layer 42 (selected word line WL). By setting the resetting voltage in this way, the voltage applied to the memory cell MC can be set substantially constant, even in conductive layers 42 (word lines WL) where the wiring resistance differs depending on the position in the Z direction. As a result, in the present embodiment, it is possible to suppress variation in the voltage applied to the selected memory cell MCs.

Third Embodiment

[Configuration]

Next, a semiconductor memory device according to a third embodiment will be described with reference to FIGS. 18A and 18B. The third embodiment has a similar configuration to the first embodiment, hence in the present embodiment, a description of the configuration will be omitted. The present embodiment changes the voltages of the non-selected word lines WL and the non-selected bit lines BL during the setting operation.

[Method of Operation]

Figure 18A:
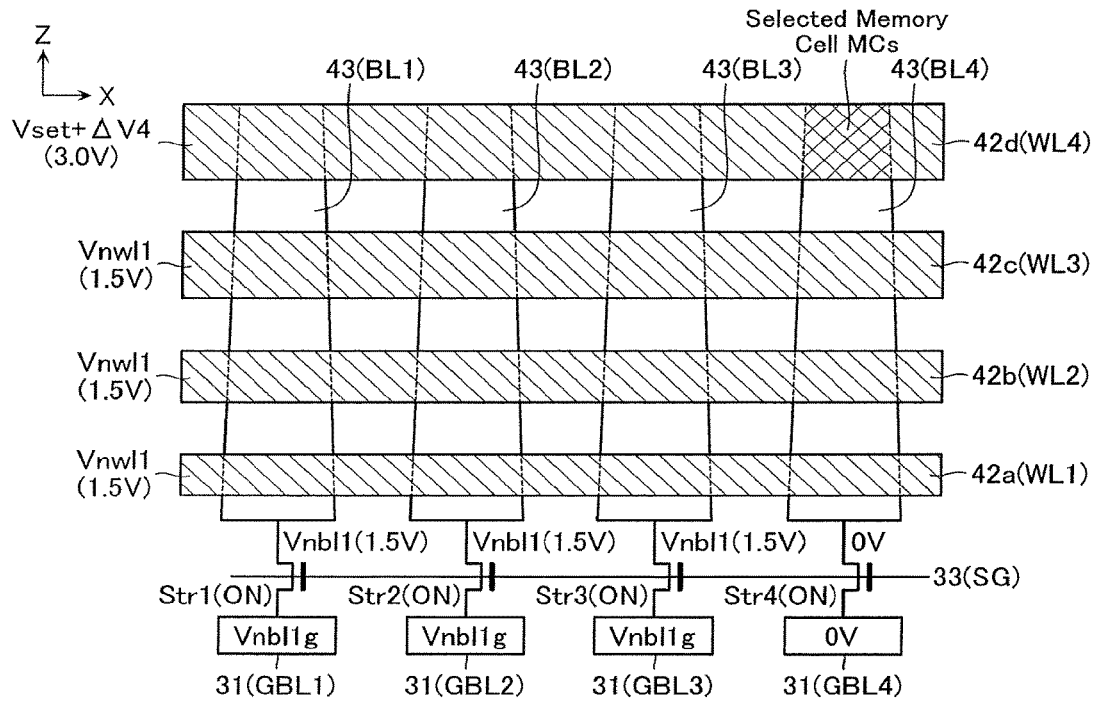
FIG. 18A is an example of a cross-sectional view showing a method of operation of a memory cell array 11 according to a third embodiment.

FIG. 18A is a cross-sectional view for explaining a voltage application state when the setting operation is executed on the memory cell MC connected to the conductive layer 42d (word line WL4) and the conductive layer 43 (bit line BL4). FIG. 18B is a cross-sectional view for explaining a voltage application state when the setting operation is executed on the memory cell MC connected to the conductive layer 42a (word line WL1) and the conductive layer 43 (bit line BL4).

As mentioned above, during the setting operation, the control circuit 16 respectively applies the setting voltages Vset+$\Delta$V1 to Vset+$\Delta$V4 to the conductive layers 42a to 42d (word lines WL1 to WL4). Now, in the present embodiment, values of the voltage Vnwl and the voltage Vnbl applied to the non-selected word lines WL and the non-selected bit lines BL during the setting operation are changed according to the setting voltages Vset+$\Delta$V1 to Vset+$\Delta$V4.

For example, as shown in FIG. 18A, when the control circuit 16 applies the setting voltage Vset+$\Delta$V4 (for example, 3.0 V) to the conductive layer 42d (word line WL4) during the setting operation, a voltage value of a non-selected word line voltage Vnwl1 is set to 1.5 V. In addition, a non-selected global bit line voltage Vnbl1g is applied to the conductive layers 31 (non-selected global bit lines GBL1 to GBL3) connected to the conductive layers (non-selected bit lines BL1 to BL3). Due to this, a voltage value of a non-selected bit line voltage Vnbl1 of the conductive layers 43 (non-selected bit lines BL1 to BL3) is set to approximately 1.5 V.

Figure 18B:
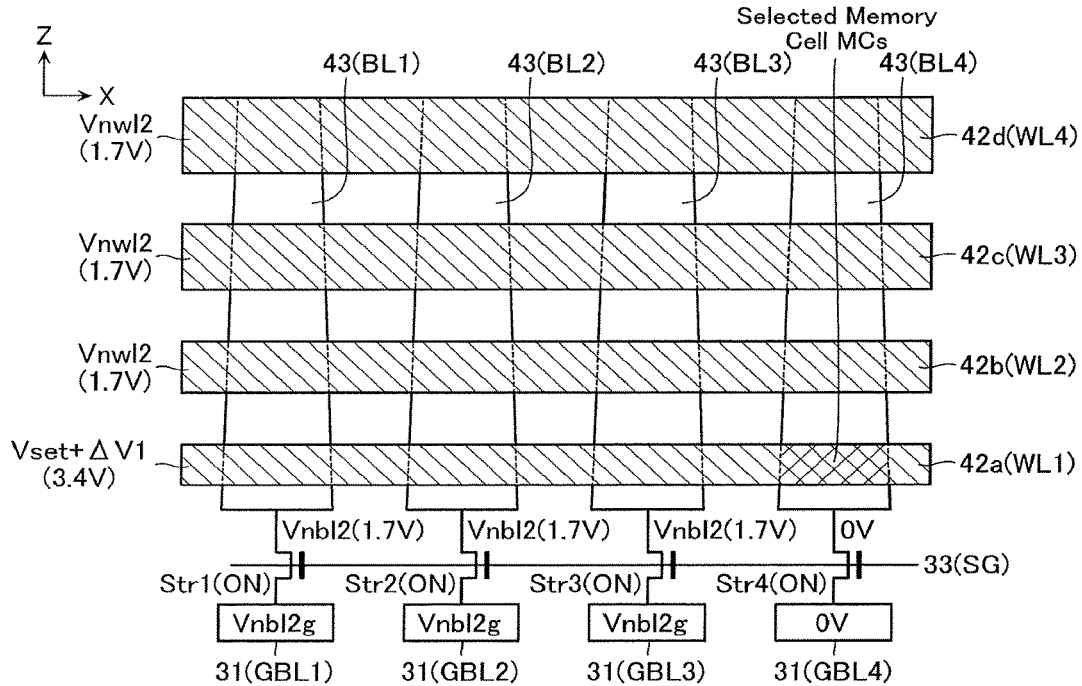
FIG. 18B is an example of a cross-sectional view showing a method of operation of the memory cell array 11 according to the third embodiment.

Moreover, as shown in FIG. 18B, when the control circuit 16 applies the setting voltage Vset+$\Delta$V1 (for example, 3.4 V) to the conductive layer 42a (word line WL1) during the setting operation, a voltage value of a non-selected word line voltage Vnwl2 is set to 1.7 V. In addition, a non-selected global bit line voltage Vnbl2g is applied to the conductive layers 31 (non-selected global bit lines GBL1 to GBL3) connected to the conductive layers (non-selected bit lines BL1 to BL3). Due to this, a voltage value of a non-selected bit line voltage Vnbl2 of the conductive layers 43 (non-selected bit lines BL1 to BL3) is set to approximately 1.7 V. Now, a relationship Vnbl2g>Vnbl1g holds.

As mentioned above, during the setting operation, the control circuit 16 respectively applies the setting voltages Vset+$\Delta$V1 to Vset+$\Delta$V4 to the conductive layers 42a to 42d (word lines WL1 to WL4). In the present embodiment, values of the non-selected word line voltage Vnwl and the non-selected bit line voltage Vnbl are changed corresponding to these setting voltages Vset+$\Delta$V1 to Vset+$\Delta$V4. Only one of the values of the non-selected word line voltage Vnwl and the non-selected bit line voltage Vnbl may be changed, or both may be changed.

[Advantages]

In the operation of the present embodiment, the control circuit changes the value of the voltage applied to the non-selected conductive layers 42 (word lines WL) or the conductive layers 31 (global bit lines GBL) connected to the non-selected conductive layers 43 (bit lines BL), based on the position in the Z direction of the selected conductive layer 42 (selected word line WL). As a result, it is possible to suppress an excessive voltage being applied to non-selected memory cells MC connected between the selected word line WL and the non-selected bit lines BL. As a result, it is possible to suppress the setting operation being mistakenly executed on the non-selected memory cells MC.

Fourth Embodiment

[Configuration]

Next, a semiconductor memory device according to a fourth embodiment will be described with reference to FIGS. 19A and 19B. The fourth embodiment has a similar configuration to the first embodiment, hence in the present embodiment, a description of the configuration will be omitted. The present embodiment changes the voltages of the non-selected word lines WL and the non-selected bit lines BL during the resetting operation.

[Method of Operation]

Figure 19A:
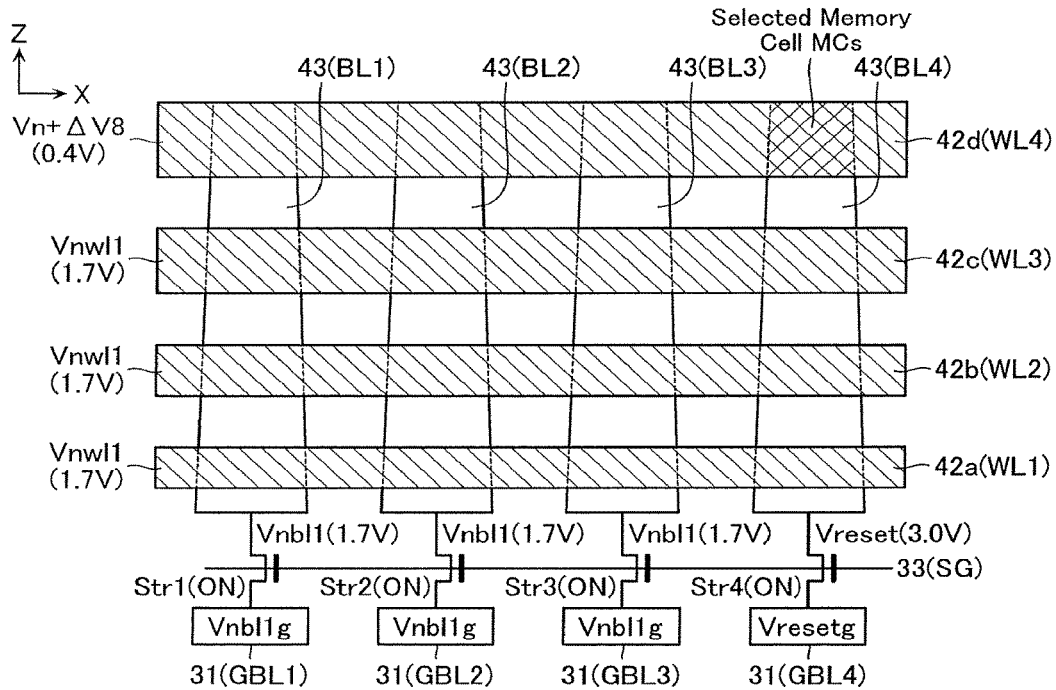
FIG. 19A is an example of a cross-sectional view showing a method of operation of a memory cell array 11 according to a fourth embodiment.

FIG. 19A is a cross-sectional view for explaining a voltage application state when the resetting operation is executed on the memory cell MC connected to the conductive layer 42d (word line WL4) and the conductive layer 43 (bit line BL4). FIG. 19B is a cross-sectional view for explaining a voltage application state when the resetting operation is executed on the memory cell MC connected to the conductive layer 42a (word line WL1) and the conductive layer 43 (bit line BL4).

As mentioned above, during the resetting operation, the control circuit 16 respectively applies the voltages Vn+ΔV5 to Vn+ΔV8 to the conductive layers 42a to 42d (word lines WL1 to WL4). Now, in the present embodiment, values of the voltage Vnwl and the voltage Vnbl applied to the non-selected word lines WL and the non-selected bit lines BL during the resetting operation are changed according to the voltages Vn+ΔV5 to Vn+ΔV8.

For example, as shown in FIG. 19A, the control circuit 16 applies the voltage Vn+ΔV8 (for example, 0.4 V) to the conductive layer 42d (word line WL4) during the resetting operation, a voltage value of the non-selected word line voltage Vnwl1 is set to 1.7 V. In addition, the non-selected global bit line voltage Vnbl1g is applied to the conductive layers 31 (non-selected global bit lines GBL1 to GBL3) connected to the conductive layers 43 (non-selected bit lines BL1 to BL3). Due to this, a voltage value of the non-selected bit line voltage Vnbl1 of the conductive layers 43 (non-selected bit lines BL1 to BL3) is set to approximately 1.7 V.

Figure 19B:
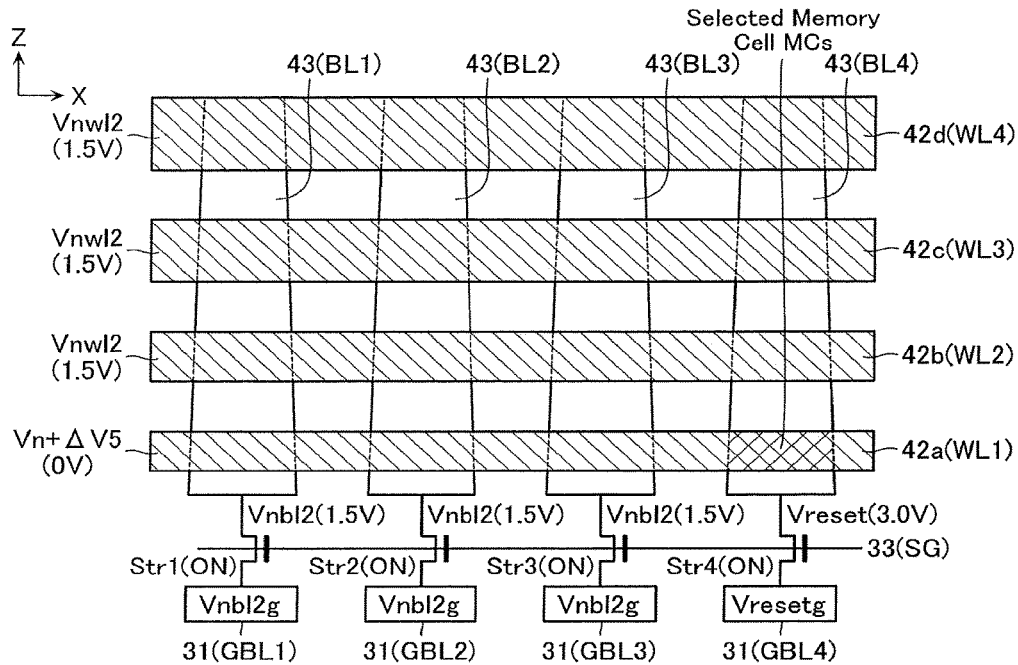
FIG. 19B is an example of a cross-sectional view showing a method of operation of the memory cell array 11 according to the fourth embodiment.

Moreover, as shown in FIG. 19B, when the control circuit 16 applies the voltage Vn+ΔV5 (for example, 0 V) to the conductive layer 42a (word line WL1) during the resetting operation, a voltage value of the non-selected word line voltage Vnwl2 is set to 1.5 V. In addition, the non-selected global bit line voltage Vnbl2g is applied to the conductive layers 31 (non-selected global bit lines GBL1 to GBL3) connected to the conductive layers 43 (non-selected bit lines BL1 to BL3). Due to this, a voltage value of the non-selected bit line voltage Vnbl2 of the conductive layers 43 (non-selected bit lines BL1 to BL3) is set to approximately 1.5 V. Now, a relationship Vnbl1g>Vnbl2g holds.

As mentioned above, during the resetting operation, the control circuit 16 respectively applies the voltages Vn+ΔV5 to Vn+ΔV8 to the conductive layers 42a to 42d (word lines WL1 to WL4). In the present embodiment, values of the non-selected word line voltage Vnwl and the non-selected bit line voltage Vnbl are changed corresponding to these voltages Vn+ΔV5 to Vn+ΔV8. Only one of the values of the non-selected word line voltage Vnwl and the non-selected bit line voltage Vnbl may be changed, or both may be changed.

[Advantages]

In the operation of the present embodiment, the control circuit changes the value of the voltage applied to the non-selected conductive layers 42 (word lines WL) or the conductive layers 31 (global bit lines GBL) connected to the non-selected conductive layers 43 (bit lines BL), based on the position in the Z direction of the selected conductive layer 42 (selected word line WL). As a result, it is possible to suppress an excessive voltage being applied to the non-selected memory cells MC connected between the selected bit line BL and the non-selected word lines WL. As a result, it is possible to suppress the resetting operation being mistakenly executed on the non-selected memory cells MC.

Fifth Embodiment

[Configuration]

Next, a semiconductor memory device according to a fifth embodiment will be described with reference to FIGS. 20A and 20B. The fifth embodiment has a similar configuration to the first embodiment, hence in the present embodiment, a description of the configuration will be omitted. The present embodiment changes the voltage of the selected word line WL during the setting operation.

[Method of Operation]

Figure 20A:
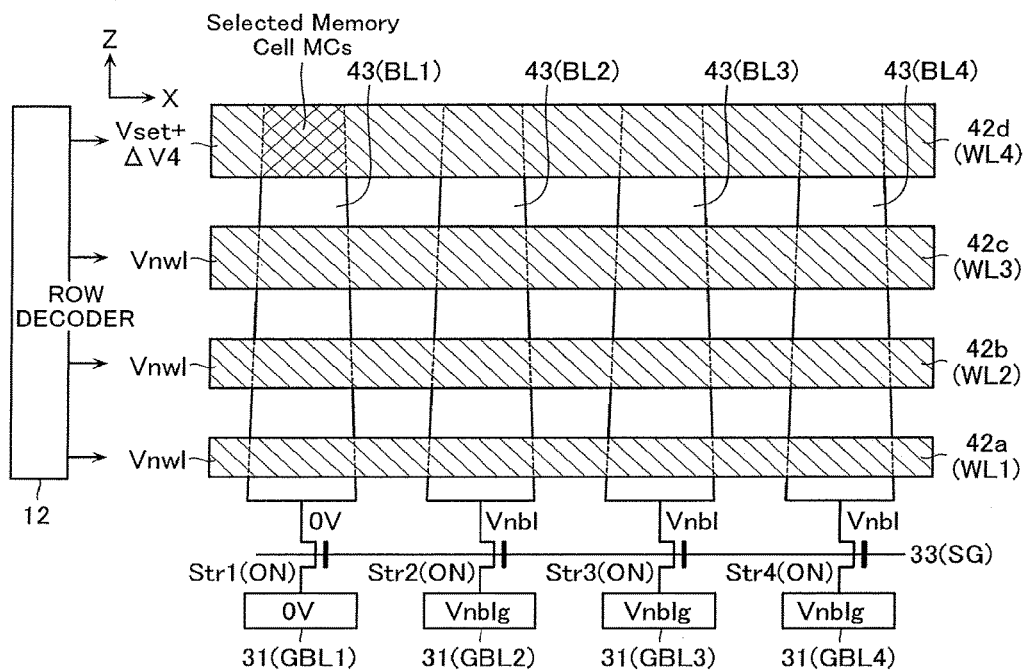
FIG. 20A is an example of a cross-sectional view showing a method of operation of a memory cell array 11 according to a fifth embodiment.
Figure 20B:
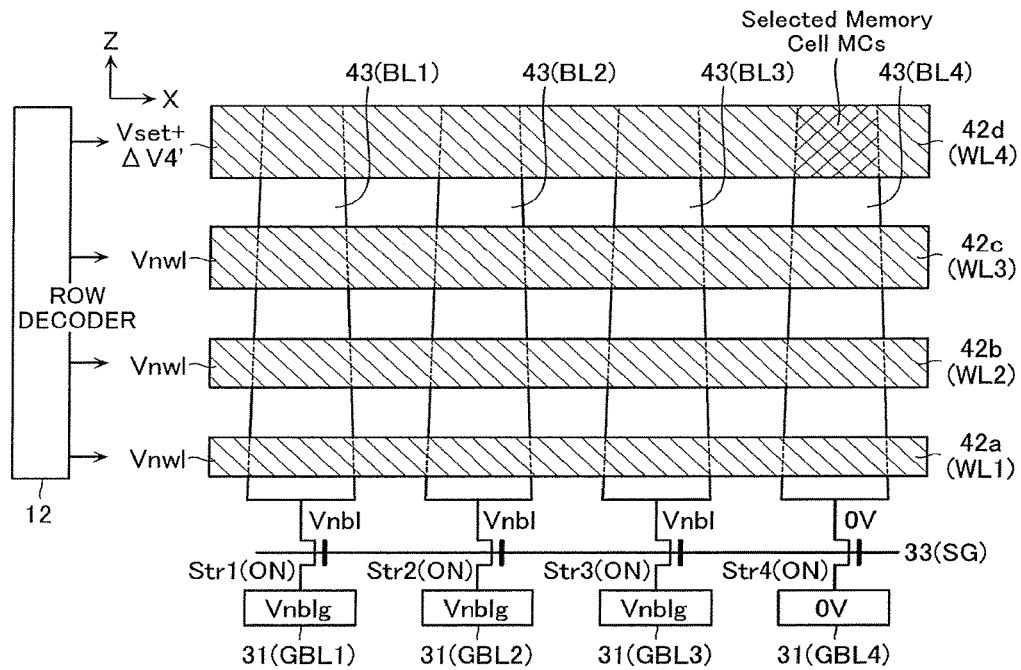
FIG. 20B is an example of a cross-sectional view showing a method of operation of the memory cell array 11 according to the fifth embodiment.

FIG. 20A is a cross-sectional view for explaining a voltage application state when the setting operation is executed on the memory cell MC connected to the conductive layer 42d (word line WL4) and the conductive layer 43 (bit line BL1). FIG. 20B is a cross-sectional view for explaining a voltage application state when the setting operation is executed on the memory cell MC connected to the conductive layer 42d (word line WL4) and the conductive layer 43 (bit line BL4).

As mentioned above, during the setting operation, the control circuit 16 applies the setting voltage Vset+ΔV4 to the conductive layer 42d (word line WL4). Now, in the present embodiment, a value of the setting voltage Vset+ΔV4 is changed based on the position of the selected memory cell MCs.

For example, as shown in FIG. 20A, when the selected memory cell MCs is at a position close to the row decoder 12, the control circuit 16 applies the setting voltage Vset+ΔV4 to the conductive layer 42d (word line WL4). On the other hand, as shown in FIG. 20B, when the selected memory cell MCs is at a position far from the row decoder 12, the control circuit 16 applies a setting voltage Vset+ΔV4' (ΔV4'>ΔV4) to the conductive layer 42d (word line WL4).

In such a way, in the present embodiment, the voltage of the selected word line WL is changed based on a position in the X direction of the selected memory cell MCs. Note that a similar operation can be executed also when the setting operation is executed on the memory cells MC connected to each of the conductive layers 42c to 42a (word lines WL3 to WL1) other than the conductive layer 42d (word line WL4). Moreover, although a description is omitted, the voltage of the selected word line WL can be changed based on the position in the X direction of the selected memory cell MCs also in the resetting operation and the read operation.

[Advantages]

In the operation of the present embodiment, the control circuit changes the value of the voltage applied to the selected conductive layer 42 (selected word line WL) based on the position in the X direction of the selected memory cell MCs. Even in an identical selected word line WL, when a distance from the row decoder 12 to the selected memory cell MCs differs, an amount of voltage drop in the selected word line WL differs. By setting the value of the setting voltage Vset applied to the selected word line WL in this way, the voltage applied to the selected memory cell MCs can be set to be substantially constant. As a result, in the present embodiment, it is possible to suppress variation in the voltage applied to the selected memory cell MCs.

Sixth Embodiment

[Configuration]

Figure 21:
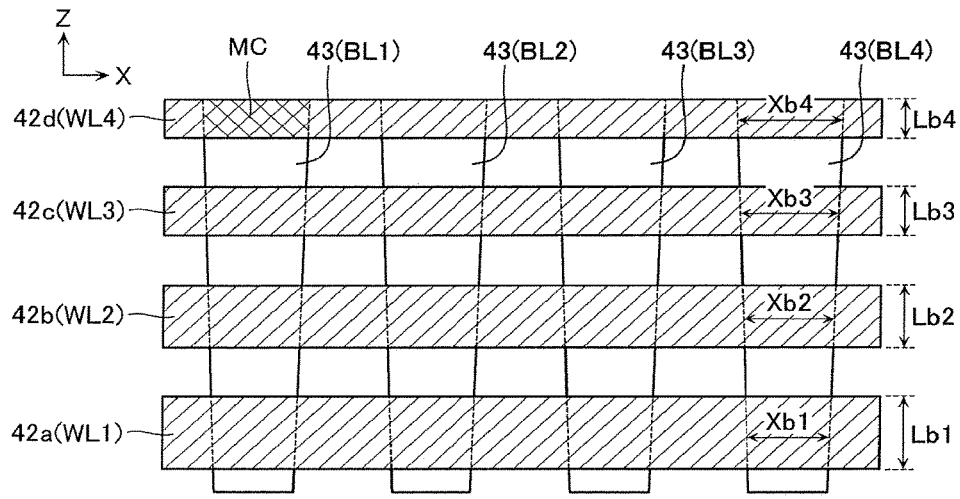
FIG. 21 is an example of a cross-sectional view showing a method of operation of a memory cell array 11 according to a sixth embodiment.

Next, a semiconductor memory device according to a sixth embodiment will be described with reference to FIGS. 21 to 25. FIG. 21 shows the memory layer 40 as seen from the Y direction. Note that in FIG. 21, the interlayer insulating layers 41a to 41d and the variable resistance layer 44 are omitted. A plane in FIG. 21 corresponds to an F6-F6 cross-section of FIG. 3.

In the sixth embodiment, as shown in FIG. 21, the conductive layer 43 is formed in an inverse tapered shape as seen from the Y direction, and a width in the X direction of a side surface in the Y direction of the conductive layer 43 becomes gradually smaller proceeding in a −Z direction (downward direction of FIG. 21). That is, the width in the X direction of the side surface in the Y direction of the conductive layer 43 at a first position is larger than the width in the X direction of the side surface in the Y direction of the conductive layer 43 at a second position lower than the first position. For example, as shown in FIG. 21, if a width of the conductive layer 43 at a position corresponding to the conductive layer 42a is assumed to be Xb1, a width of the conductive layer 43 at a position corresponding to the conductive layer 42b is assumed to be Xb2, a width of the conductive layer 43 at a position corresponding to the conductive layer 42c is assumed to be Xb3, and a width of the conductive layer 43 at a position corresponding to the conductive layer 42d is assumed to be Xb4, then Xb1<Xb2<Xb3<Xb4. Note that this inverse tapered shape of the conductive layer 43 can be formed by adjusting an etching condition during manufacturing. Now, if thicknesses in the Z direction of the conductive layers 42a to 42d are assumed to be substantially uniform, then a facing area between the conductive layer 42d and the conductive layer 43 is largest, and a facing area between the conductive layer 42a and the conductive layer 43 is smallest. As a result, variation occurs in characteristics of the variable resistance element VR formed between the conductive layers 42a to 42d (word lines WL1 to WL4) and the conductive layer 43 (bit line BL).

Accordingly, in the present embodiment, as shown in FIG. 21, the lower a layer in which the conductive layers 42a to 42d are positioned, the larger the thicknesses Lb1 to Lb4 in the Z direction are made in accordance with the above-described shape of the conductive layer 43.

Specifically, the thickness Lb1 in the Z direction of the conductive layer 42a is larger than the thickness Lb2 in the Z direction of the conductive layer 42b in a layer above the conductive layer 42a. Similarly, the thickness Lb2 in the Z direction of the conductive layer 42b is larger than the thickness Lb3 in the Z direction of the conductive layer 42c in a layer above the conductive layer 42b, and the thickness Lb3 in the Z direction of the conductive layer 42c is larger than the thickness Lb4 in the Z direction of the conductive layer 42d in a layer above the conductive layer 42c. Therefore, facing areas between the conductive layers 42a to 42d and the conductive layer 43 can be made substantially constant. As a result, in the present embodiment, it is possible to suppress variation in characteristics of the variable resistance element VR.

[Method of Operation]

Next, a method of an operation of the semiconductor memory device according to the present embodiment will be described. In the present embodiment, details of a method of voltage application during the setting operation will be described.

FIGS. 22 to 25 are cross-sectional views for explaining a voltage application state when the setting operation is executed on the memory cell MC.

As mentioned above, during the setting operation, the control circuit 16 applies the setting voltage Vset to the selected word line WL. Now, in the present embodiment, the lower a layer in which the conductive layers 42a to 42d (word lines WL1 to WL4) are positioned, the larger the thicknesses Lb1 to Lb4 in the Z direction are made. Therefore, a wiring resistance of the conductive layers 42a to 42d (word lines WL1 to WL4) changes depending on the position in the Z direction of the conductive layers 42a to 42d (word lines WL1 to WL4). For example, the conductive layer 42d (word line WL4) has a largest wiring resistance, and the conductive layer 42a (word line WL1) has a smallest wiring resistance.

In the case where the wiring resistance of the conductive layers 42 (word lines WL) differs depending on the position in the Z direction, if the value of the setting voltage Vset is set to be identical in conductive layers 42 (word lines WL) having different positions in the Z direction, then the voltage applied to the selected memory cell MCs varies based on the position in the Z direction.

Figure 22:
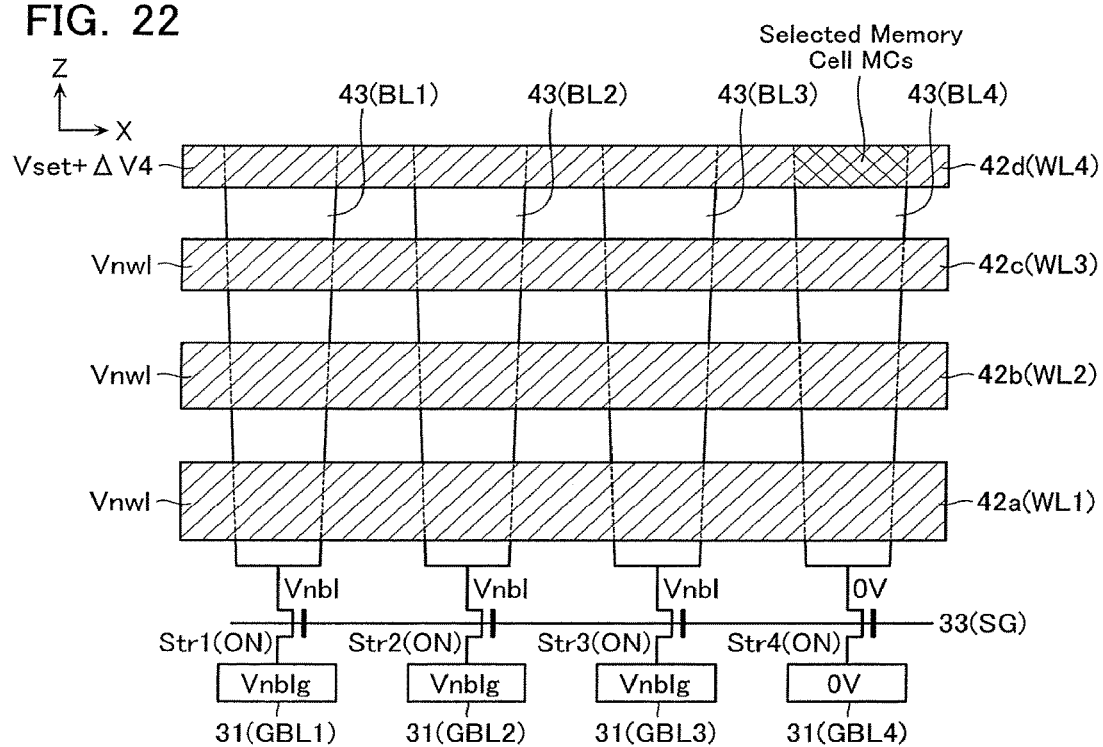
FIG. 22 is an example of a cross-sectional view showing a method of operation of the memory cell array 11 according to the sixth embodiment.
Figure 23:
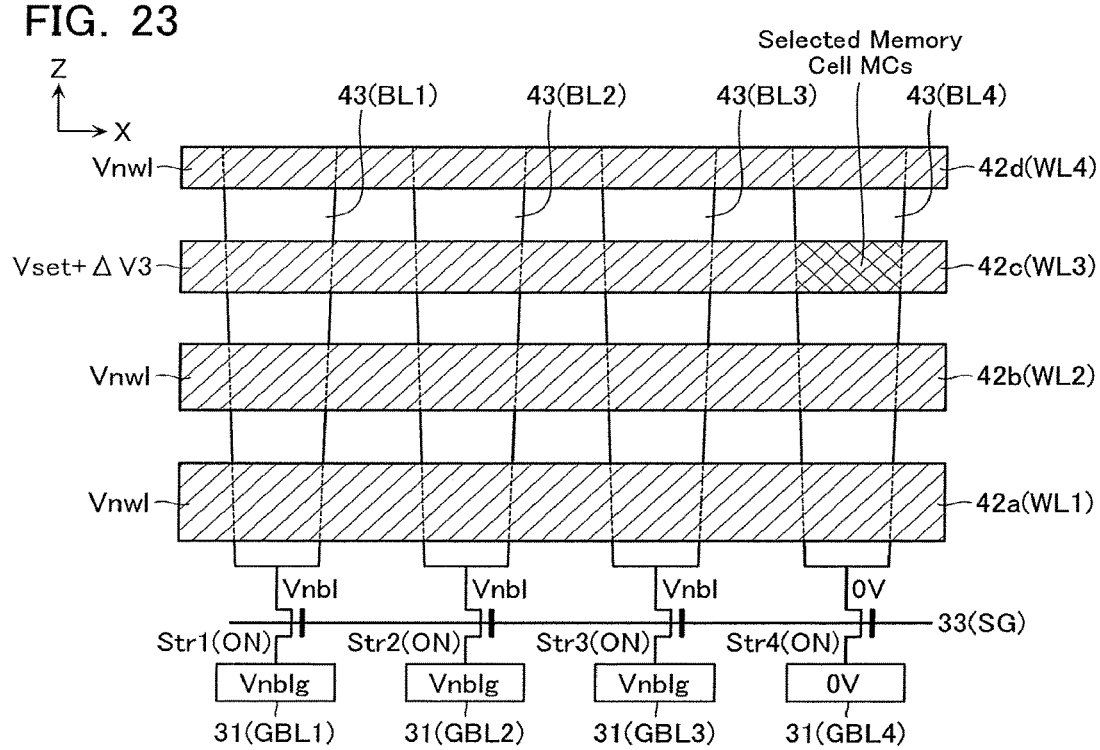
FIG. 23 is an example of a cross-sectional view showing a method of operation of the memory cell array 11 according to the sixth embodiment.
Figure 24:
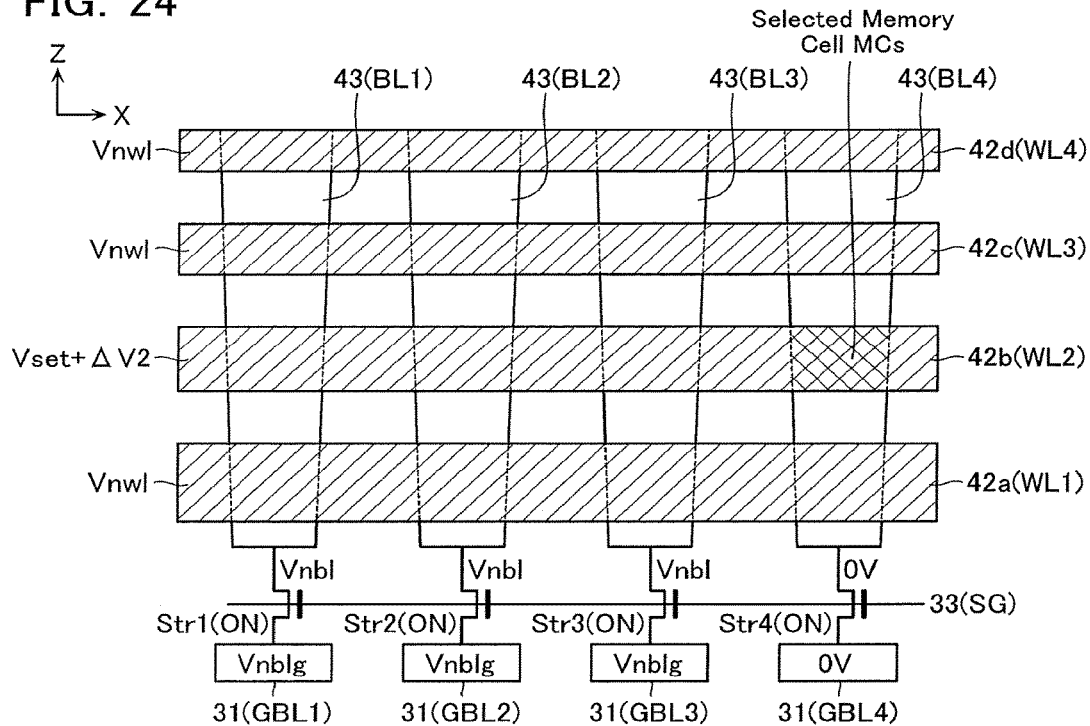
FIG. 24 is an example of a cross-sectional view showing a method of operation of the memory cell array 11 according to the sixth embodiment.
Figure 25:
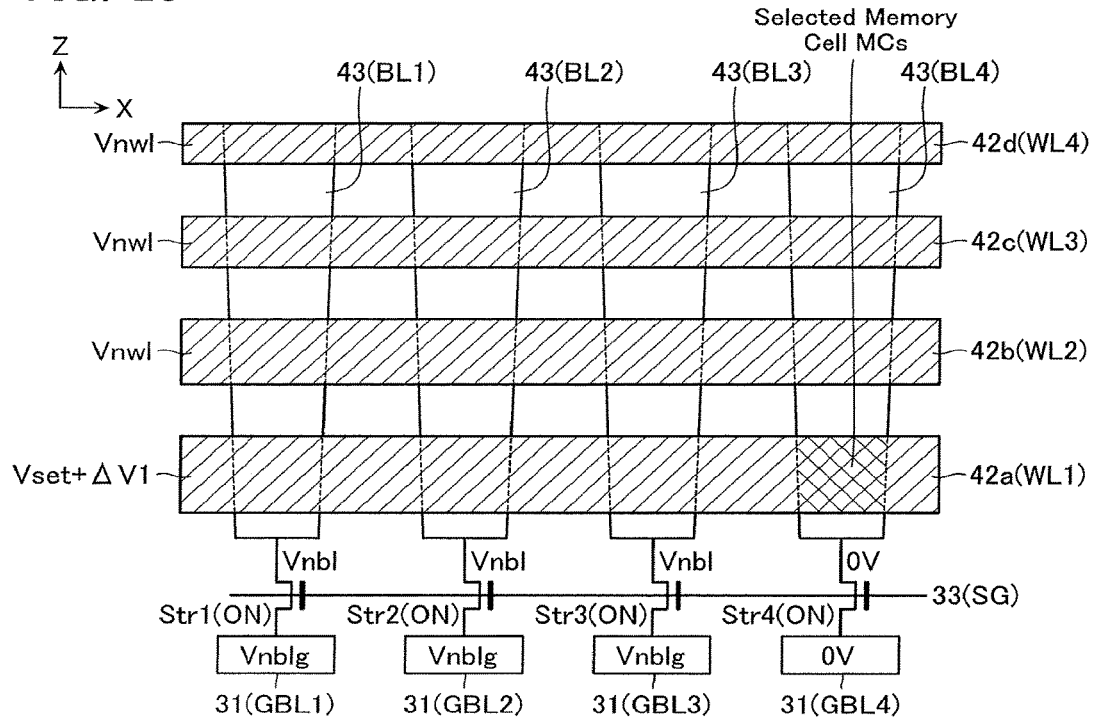
FIG. 25 is an example of a cross-sectional view showing a method of operation of the memory cell array 11 according to the sixth embodiment.

In contrast, in the present embodiment, as shown in FIGS. 22 to 25, the control circuit 16 sets each of the values of the setting voltage Vset applied to the conductive layers 42a to 42d (word lines WL1 to WL4) to a different value. As shown in FIG. 22, during the setting operation of the selected memory cell MCs connected to the conductive layer 42d (word line WL4), the control circuit 16 applies the setting voltage Vset+ΔV4 to the conductive layer 42d (word line WL4). As shown in FIG. 23, during the setting operation of the selected memory cell MCs connected to the conductive layer 42c (word line WL3), the control circuit 16 applies the setting voltage Vset+ΔV3 to the conductive layer 42c (word line WL3). As shown in FIG. 24, during the setting operation of the selected memory cell MCs connected to the conductive layer 42b (word line WL2), the control circuit 16 applies the setting voltage Vset+ΔV2 to the conductive layer 42b (word line WL2). As shown in FIG. 25, during the setting operation of the selected memory cell MCs connected to the conductive layer 42a (word line WL1), the control circuit 16 applies the setting voltage Vset+ΔV1 to the conductive layer 42a (word line WL1).

At this time, the values ΔV1 to ΔV4 are set such that ΔV4>ΔV3>ΔV2>ΔV1. That is, the setting voltages Vset+ΔV1 to Vset+ΔV4 are set such that the lower a layer in which the conductive layers 42a to 42d (word lines WL1 to WL4) are positioned, the smaller the applied voltage during the setting operation becomes. The voltage values during the setting operation may be set such that the setting voltage Vset+ΔV4 is about 1.3 times the setting voltage Vset+ΔV1.

[Advantages]

In the operation of the present embodiment, the control circuit changes the value of the voltage applied to the selected conductive layer 42 (selected word line WL) based on the position in the Z direction of the selected conductive layer 42 (selected word line WL). By setting the setting voltage in this way, the voltage applied to the memory cell MC can be set substantially constant, even in conductive layers 42 (word lines WL) where the wiring resistance differs depending on the position in the Z direction. As a result, in the present embodiment, it is possible to suppress variation in the voltage applied to the selected memory cell MCs.

Seventh Embodiment

[Configuration]

Next, a semiconductor memory device according to a seventh embodiment will be described with reference to FIGS. 26 to 29. The seventh embodiment has a similar configuration to the sixth embodiment, hence in the present embodiment, a description of the configuration will be omitted. The present embodiment describes the resetting operation.

[Method of Operation]

In the present embodiment, details of a method of voltage application during the resetting operation will be described.

FIGS. 26 to 29 are cross-sectional views for explaining a voltage application state when the resetting operation is executed on the memory cell MC.

As mentioned above, during the resetting operation, the control circuit 16 applies the resetting voltage Vreset to the selected bit line BL. Now, in the present embodiment, the lower a layer in which the conductive layers 42a to 42d (word lines WL1 to WL4) are positioned, the larger the thicknesses Lb1 to Lb4 in the Z direction are made. Therefore, a wiring resistance of the conductive layers 42a to 42d (word lines WL1 to WL4) changes depending on the position in the Z direction of the conductive layers 42a to 42d (word lines WL1 to WL4). For example, the conductive layer 42d (word line WL4) has a largest wiring resistance, and the conductive layer 42a (word line WL1) has a smallest wiring resistance.

In the case where the wiring resistance of the conductive layers 42 (word lines WL) differs depending on the position in the Z direction, if the value of the word line voltage is set to be identical in conductive layers 42 (word lines WL) having different positions in the Z direction, then the voltage applied to the selected memory cell MCs varies based on the position in the Z direction.

Figure 26:
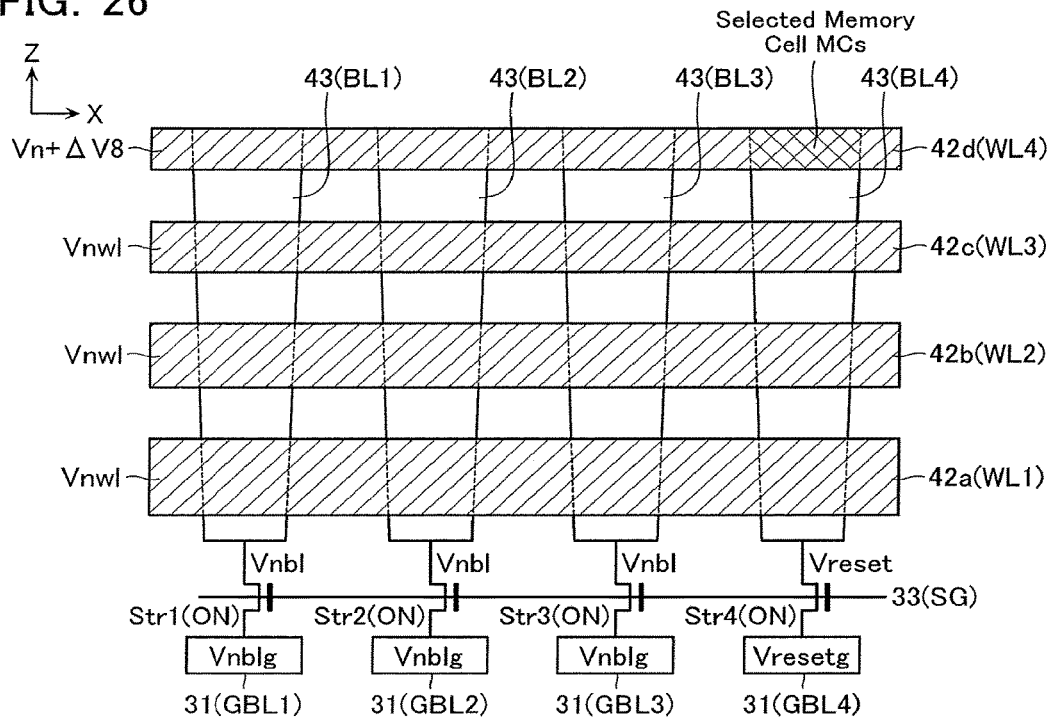
FIG. 26 is an example of a cross-sectional view showing a method of operation of a memory cell array 11 according to a seventh embodiment.
Figure 27:
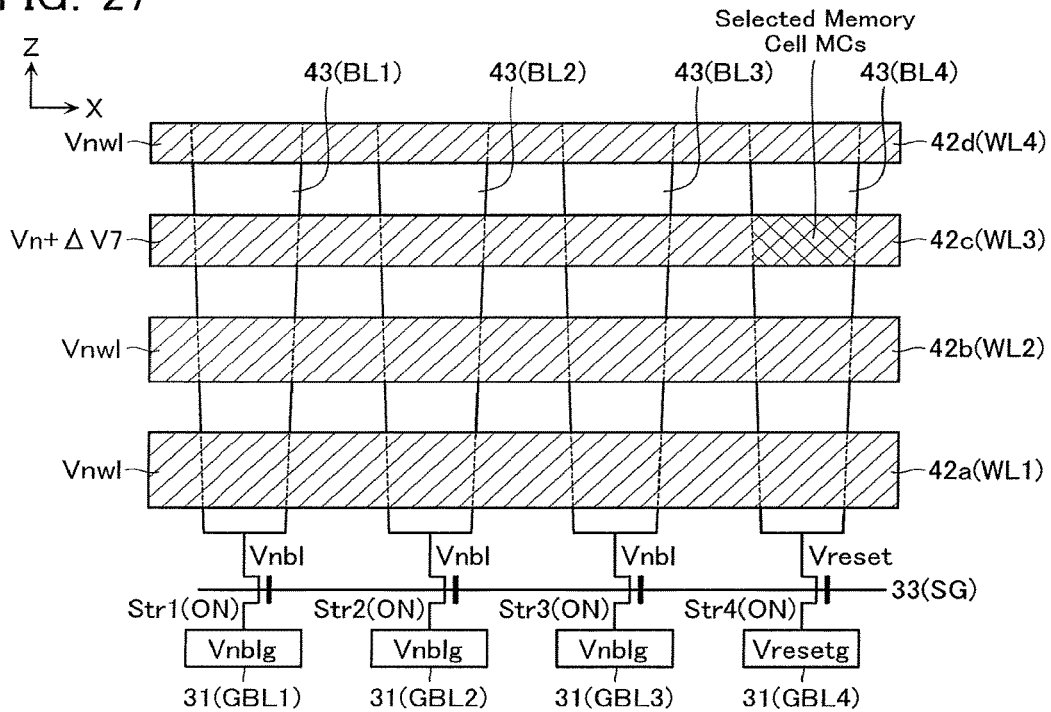
FIG. 27 is an example of a cross-sectional view showing a method of operation of the memory cell array 11 according to the seventh embodiment.

In contrast, in the present embodiment, as shown in FIGS. 26 to 29, the control circuit 16 sets each of the values of the voltage applied to the conductive layers 42a to 42d (word lines WL1 to WL4) to a different value. As shown in FIG. 26, during the resetting operation of the selected memory cell MCs connected to the conductive layer 42d (word line WL4), the control circuit 16 applies the voltage Vn+ΔV8 to the conductive layer 42d (word line WL4). As shown in FIG. 27, during the resetting operation of the selected memory cell MCs connected to the conductive layer 42c (word line WL3), the control circuit 16 applies the voltage Vn+ΔV7 to the conductive layer 42c (word line WL3). As shown in FIG. 28, during the resetting operation of the selected memory cell MCs connected to the conductive layer 42b (word line WL2), the control circuit 16 applies the voltage Vn+ΔV6 to the conductive layer 42b (word line WL2). As shown in FIG. 29, during the resetting operation of the selected memory cell MCs connected to the conductive layer 42a (word line WL1), the control circuit 16 applies the voltage Vn+ΔV5 to the conductive layer 42a (word line WL1).

At this time, the values ΔV5 to ΔV8 are set such that ΔV5>ΔV6>ΔV7>ΔV8. That is, the voltages Vn+ΔV5 to Vn+ΔV8 are set such that the lower a layer in which the conductive layers 42a to 42d are positioned, the larger the applied voltage during the resetting operation becomes. The voltage values during the resetting operation may be set such that the voltage Vn+ΔV5 is about one tenth of the resetting voltage Vreset.

[Advantages]

In the operation of the present embodiment, the control circuit changes the value of the voltage applied to the selected conductive layer 42 (selected word line WL) based on the position in the Z direction of the selected conductive layer 42 (selected word line WL). By setting the resetting voltage in this way, the voltage applied to the memory cell MC can be set substantially constant, even in conductive layers 42 (word lines WL) where the wiring resistance differs depending on the position in the Z direction. As a result, in the present embodiment, it is possible to suppress variation in the voltage applied to the selected memory cell MCs.

Eighth Embodiment

[Configuration]

Next, a semiconductor memory device according to an eighth embodiment will be described with reference to FIGS. 30A and 30B. The eighth embodiment has a similar configuration to the sixth embodiment, hence in the present embodiment, a description of the configuration will be omitted. The present embodiment changes the voltages of the non-selected word lines WL and the non-selected bit lines BL during the setting operation.

[Method of Operation]

Figure 30A:
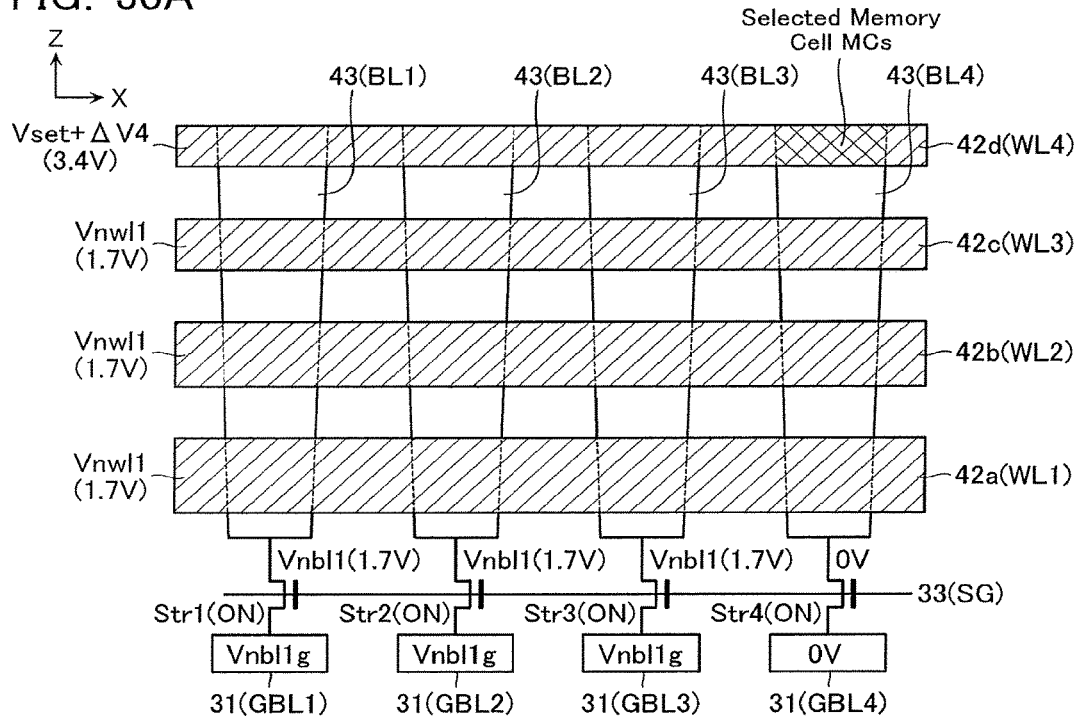
FIG. 30A is an example of a cross-sectional view showing a method of operation of a memory cell array 11 according to an eighth embodiment.

FIG. 30A is a cross-sectional view for explaining a voltage application state when the setting operation is executed on the memory cell MC connected to the conductive layer 42d (word line WL4) and the conductive layer 43 (bit line BL4). FIG. 30B is a cross-sectional view for explaining a voltage application state when the setting operation is executed on the memory cell MC connected to the conductive layer 42a (word line WL1) and the conductive layer 43 (bit line BL4).

As mentioned above, during the setting operation, the control circuit 16 respectively applies the setting voltages Vset+ΔV1 to Vset+ΔV4 to the conductive layers 42a to 42d (word lines WL1 to WL4). Now, in the present embodiment, the values of the voltage Vnwl and the voltage Vnbl applied to the non-selected word lines WL and the non-selected bit lines BL during the setting operation are changed according to the setting voltages Vset+ΔV1 to Vset+ΔV4.

For example, as shown in FIG. 30A, when the control circuit 16 applies the setting voltage Vset+ΔV4 (for example, 3.4 V) to the conductive layer 42d (word line WL4), the voltage value of the non-selected word line voltage Vnwl1 is set to 1.7 V. In addition, the non-selected global bit line voltage Vnbl1g is applied to the conductive layers (non-selected global bit lines GBL1 to GBL3) connected to the conductive layers 43 (non-selected bit lines BL1 to BL3). Due to this, the voltage value of the non-selected bit line voltage Vnbl1 of the conductive layers 43 (non-selected bit lines BL1 to BL3) is set to approximately 1.7 V.

Figure 30B:
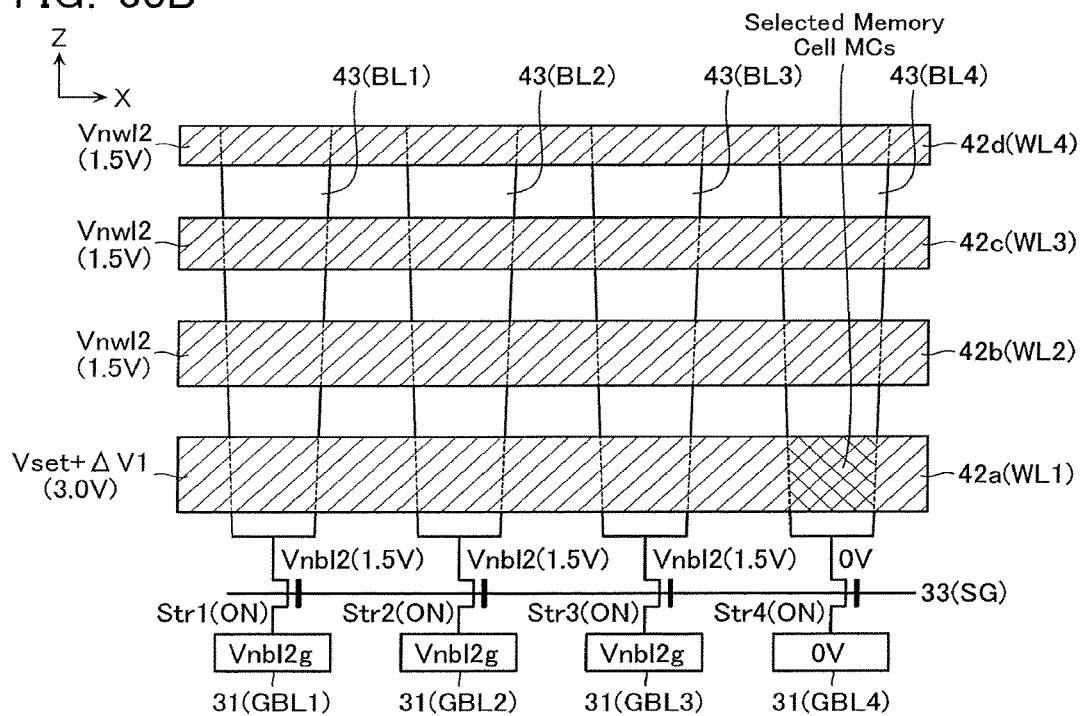
FIG. 30B is an example of a cross-sectional view showing a method of operation of the memory cell array 11 according to the eighth embodiment.

Moreover, as shown in FIG. 30B, when the control circuit 16 applies the setting voltage Vset+ΔV1 (for example, 3.0 V) to the conductive layer 42a (word line WL1) during the setting operation, the voltage value of the non-selected word line voltage Vnwl2 is set to 1.5 V. In addition, the non-selected global bit line voltage Vnbl1g is applied to the conductive layers 31 (non-selected global bit lines GBL1 to GBL3) connected to the conductive layers 43 (non-selected bit lines BL1 to BL3). Due to this, the voltage value of the non-selected bit line voltage Vnbl2 of the conductive layers 43 (non-selected bit lines BL1 to BL3) is set to approximately 1.5 V. Now, a relationship Vnbl1g>Vnbl1g holds.

As mentioned above, during the setting operation, the control circuit 16 respectively applies the setting voltages Vset+$\Delta$V1 to Vset+$\Delta$V4 to the conductive layers 42a to 42d (word lines WL1 to WL4). In the present embodiment, the values of the non-selected word line voltage Vnwl and the non-selected bit line voltage Vnbl are changed corresponding to these setting voltages Vset+$\Delta$V1 to Vset+$\Delta$V4. Only one of the values of the non-selected word line voltage Vnwl and the non-selected bit line voltage Vnbl may be changed, or both may be changed.

[Advantages]

In the operation of the present embodiment, the control circuit changes the value of the voltage applied to the non-selected conductive layers 42 (word lines WL) or the conductive layers 31 (global bit lines GBL) connected to the non-selected conductive layers 43 (bit lines BL), based on the position in the Z direction of the selected conductive layer 42 (selected word line WL). As a result, it is possible to suppress an excessive voltage being applied to the non-selected memory cells MC connected between the selected word line WL and the non-selected bit lines BL. As a result, it is possible to suppress the setting operation being mistakenly executed on the non-selected memory cells MC.

Ninth Embodiment

[Configuration]

Next, a semiconductor memory device according to a ninth embodiment will be described with reference to FIGS. 31A and 31B. The ninth embodiment has a similar configuration to the sixth embodiment, hence in the present embodiment, a description of the configuration will be omitted. The present embodiment changes the voltages of the non-selected word lines WL and the non-selected bit lines BL during the resetting operation.

[Method of Operation]

FIG. 31A is a cross-sectional view for explaining a voltage application state when the resetting operation is executed on the memory cell MC connected to the conductive layer 42d (word line WL4) and the conductive layer 43 (bit line BL4). FIG. 31B is a cross-sectional view for explaining a voltage application state when the resetting operation is executed on the memory cell MC connected to the conductive layer 42a (word line WL1) and the conductive layer 43 (bit line BL4).

As mentioned above, during the resetting operation, the control circuit 16 respectively applies the voltages Vn+$\Delta$V5 to Vn+$\Delta$V8 to the conductive layers 42a to 42d (word lines WL1 to WL4). Now, in the present embodiment, the values of the voltage Vnwl and the voltage Vnbl applied to the non-selected word lines WL and the non-selected bit lines BL during the resetting operation are changed according to the voltages Vn+$\Delta$V5 to Vn+$\Delta$V8.

For example, as shown in FIG. 31A, when the control circuit 16 applies the voltage Vn+$\Delta$V8 (for example, 0 V) to the conductive layer 42d (word line WL4) during the resetting operation, the voltage value of the non-selected word line voltage Vnwl1 is set to 1.5 V. In addition, the non-selected global bit line voltage Vnbl1g is applied to the conductive layers 31 (non-selected global bit lines GBL1 to GBL3) connected to the conductive layers 43 (non-selected bit lines BL1 to BL3). Due to this, the voltage value of the non-selected bit line voltage Vnbl1 of the conductive layers 43 (non-selected bit lines BL1 to BL3) is set to approximately 1.5 V.

Moreover, as shown in FIG. 31B, when the control circuit 16 applies the voltage Vn+$\Delta$V5 (for example, 0.4 V) to the conductive layer 42a (word line WL1), the voltage value of the non-selected word line voltage Vnwl2 is set to 1.7 V. In addition, the non-selected global bit line voltage Vnbl2g is applied to the conductive layers 31 (non-selected global bit lines GBL1 to GBL3) connected to the conductive layers 43 (non-selected bit lines BL1 to BL3). Due to this, the voltage value of the non-selected bit line voltage Vnbl2 of the conductive layers 43 (non-selected bit lines BL1 to BL3) is set to approximately 1.7 V. Now, a relationship Vnbl2g>Vnbl1g holds.

As mentioned above, during the resetting operation, the control circuit 16 respectively applies the voltages Vn+$\Delta$V5 to Vn+$\Delta$V8 to the conductive layers 42a to 42d (word lines WL1 to WL4). In the present embodiment, the values of the non-selected word line voltage Vnwl and the non-selected bit line voltage Vnbl are changed corresponding to these voltages Vn+$\Delta$V5 to Vn+$\Delta$V8. Only one of the values of the non-selected word line voltage Vnwl and the non-selected bit line voltage Vnbl may be changed, or both may be changed.

[Advantages]

In the operation of the present embodiment, the control circuit changes the value of the voltage applied to the non-selected conductive layers 42 (word lines WL) or the conductive layers 31 (global bit lines GBL) connected to the non-selected conductive layers 43 (bit lines BL), based on the position in the Z direction of the selected conductive layer 42 (selected word line WL). As a result, it is possible to suppress an excessive voltage being applied to the non-selected memory cells MC connected between the selected bit line BL and the non-selected word lines WL. As a result, it is possible to suppress the resetting operation being mistakenly executed on the non-selected memory cells MC.

Tenth Embodiment

[Configuration]

Next, a semiconductor memory device according to a tenth embodiment will be described with reference to FIGS. 32A and 32B. The tenth embodiment has a similar configuration to the sixth embodiment, hence in the present embodiment, a description of the configuration will be omitted. The present embodiment changes the voltage of the selected word line WL during the setting operation.

[Method of Operation]

Figure 32A:
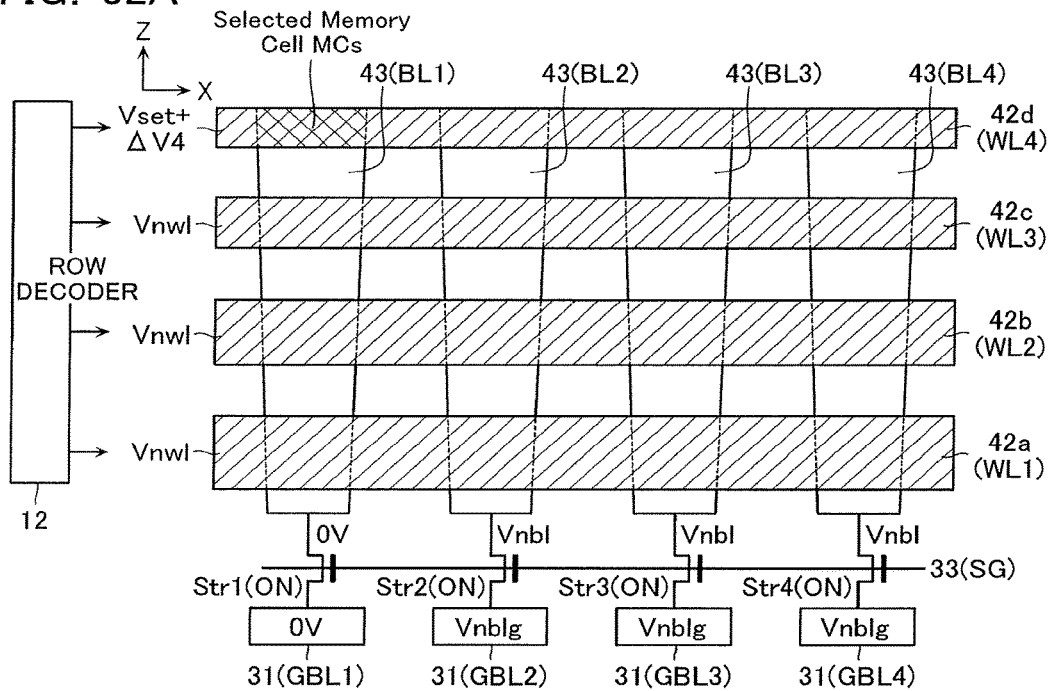
FIG. 32A is an example of a cross-sectional view showing a method of operation of a memory cell array 11 according to a tenth embodiment.
Figure 32B:
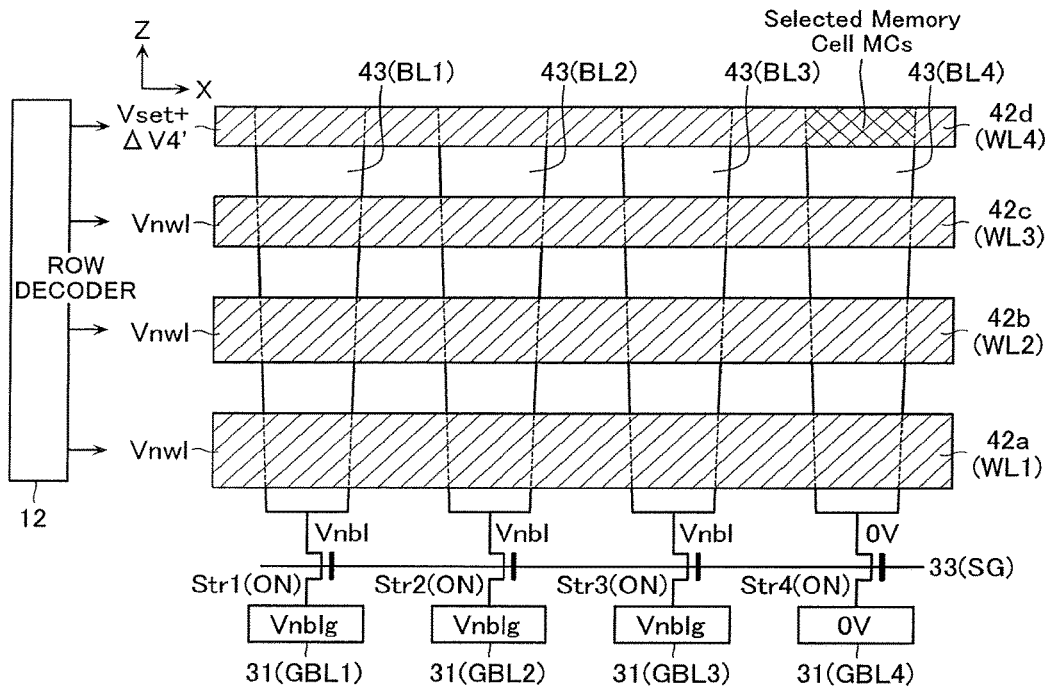
FIG. 32B is an example of a cross-sectional view showing a method of operation of the memory cell array 11 according to the tenth embodiment.

FIG. 32A is a cross-sectional view for explaining a voltage application state when the setting operation is executed on the memory cell MC connected to the conductive layer 42d (word line WL4) and the conductive layer 43 (bit line BL1). FIG. 32B is a cross-sectional view for explaining a voltage application state when the setting operation is executed on the memory cell MC connected to the conductive layer 42d (word line WL4) and the conductive layer 43 (bit line BL4).

As mentioned above, during the setting operation, the control circuit 16 applies the setting voltage Vset+$\Delta$V4 to the conductive layer 42d (word line WL4). Now, in the present embodiment, the value of the setting voltage Vset+$\Delta$V4 is changed based on the position of the selected memory cell MCs.

For example, as shown in FIG. 32A, when the selected memory cell MCs is at a position close to the row decoder 12, the control circuit 16 applies the setting voltage Vset+ ΔV4 to the conductive layer 42d (word line WL4). On the other hand, as shown in FIG. 32B, when the selected memory cell MCs is at a position far from the row decoder 12, the control circuit 16 applies the setting voltage Vset+ ΔV4' (ΔV4'>ΔV4) to the conductive layer 42d (word line WL4).

In such a way, in the present embodiment, the voltage of the selected word line WL is changed based on the position in the X direction of the selected memory cell MCs. Note that a similar operation can be executed also when the setting operation is executed on the memory cells MC connected to each of the conductive layers 42c to 42a (word lines WL3 to WL1) other than the conductive layer 42d (word line WL4). Moreover, although a description is omitted, the voltage of the selected word line WL can be changed based on the position in the X direction of the selected memory cell MCs also in the resetting operation and the read operation.

[Advantages]

In the operation of the present embodiment, the control circuit changes the value of the voltage applied to the selected conductive layer 42 (selected word line WL) based on the position in the X direction of the selected memory cell MCs. Even in an identical selected word line WL, when the distance from the row decoder 12 to the selected memory cell MCs differs, the amount of voltage drop in the selected word line WL differs. By setting the value of the setting voltage Vset applied to the selected word line WL in this way, the voltage applied to the selected memory cell MCs can be set to be substantially constant. As a result, in the present embodiment, it is possible to suppress variation in the voltage applied to the selected memory cell MCs.

[Other]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising a memory cell array and a control circuit,
   the memory cell array including:
   a plurality of first conductive layers that are stacked in a first direction perpendicular to a substrate and extend in a second direction parallel to the substrate;
   a memory layer provided on a side surface of the plurality of the first conductive layers; and
   a second conductive layer that extends in the first direction and includes a first side surface that contacts the side surface of the plurality of the first conductive layers via the memory layer,
   a first width in the second direction of the first side surface of the second conductive layer at a first position in the first direction being larger than a second width in the second direction of the first side surface of the second conductive layer at a second position in the first direction nearer to the substrate than the first position, and a third width in the second direction of the first side surface of the second conductive layer at a third position in the first direction between the first position and the second position being smaller than the first width and larger than the second width,
   a first thickness in the first direction of the first conductive layer disposed at the first position being smaller than a second thickness in the first direction of the first conductive layer disposed at the second position, and a third thickness in the first direction of the first conductive layer disposed at the third position being larger than the first thickness and smaller than the second thickness,
   the control circuit being configured to apply a first voltage to a selected first conductive layer of the first conductive layers and provide a second voltage to the second conductive layer, and
   the control circuit being configured to, when the control circuit applies the first voltage to the selected first conductive layer, change a value of the first voltage based on a relative position in the first direction of the selected first conductive layer.

2. The semiconductor memory device according to claim 1, wherein
   the control circuit is configured to, when the control circuit applies a third voltage to a non-selected first conductive layer of the first conductive layers, change a value of the third voltage based on a relative position in the first direction of the selected first conductive layer.

3. The semiconductor memory device according to claim 1, wherein
   a plurality of the second conductive layers are disposed in the second direction,
   the control circuit is configured to apply the second voltage to a selected second conductive layer of the second conductive layers, and
   the control circuit is configured to, when the control circuit applies a fourth voltage to a non-selected second conductive layer of the second conductive layers, change a value of the fourth voltage based on a relative position in the first direction of the selected first conductive layer.

4. The semiconductor memory device according to claim 1, wherein
   a plurality of the second conductive layers are disposed in the second direction,
   the control circuit is configured to provide the second voltage to a selected second conductive layer of the second conductive layers, and
   the control circuit is configured to, when the control circuit applies the first voltage to the selected first conductive layer, change a value of the first voltage based on a relative position in the second direction of the selected second conductive layer.

5. The semiconductor memory device according to claim 1, wherein
   the memory cell array further comprises:
   a third conductive layer that extends in a third direction orthogonal to the first direction and the second direction; and
   a select transistor that contacts an upper surface of the third conductive layer and a lower surface of the second conductive layer, and the control circuit is configured to provide the second voltage to the second conductive layer by applying a fifth voltage to the third conductive layer.

6. The semiconductor memory device according to claim 1, wherein
a magnitude relationship of thicknesses in the first direction of the first conductive layers are not reversed between the first position and the second position.

7. The semiconductor memory device according to claim 1, wherein
the first conductive layers are disposed between the first position and the second position, the first conductive layers provided between the first position and the second position having thicknesses larger than the first thickness and smaller than the second thickness.

8. The semiconductor memory device according to claim 7, wherein
each of the first conductive layers provided between the first position and the second position has a thickness not smaller than that of a first conductive layer adjacent from a nearest side to the first position.

* * * * *